US008564700B2

(12) United States Patent
Kanamori et al.

(10) Patent No.: US 8,564,700 B2
(45) Date of Patent: *Oct. 22, 2013

(54) IMAGE PROCESSING DEVICE, IMAGE PROCESSING METHOD, AND IMAGING DEVICE USING A PATTERNED POLARIZER

(75) Inventors: Katsuhiro Kanamori, Nara (JP); Satoshi Sato, Osaka (JP)

(73) Assignee: Panasonic Corporation, Osaka (JP)

( * ) Notice: Subject to any disclaimer, the term of this patent is extended or adjusted under 35 U.S.C. 154(b) by 637 days.

This patent is subject to a terminal disclaimer.

(21) Appl. No.: 12/744,423

(22) PCT Filed: Nov. 28, 2008

(86) PCT No.: PCT/JP2008/003531
§ 371 (c)(1),
(2), (4) Date: May 24, 2010

(87) PCT Pub. No.: WO2009/072260
PCT Pub. Date: Jun. 11, 2009

(65) Prior Publication Data
US 2010/0253820 A1    Oct. 7, 2010

(30) Foreign Application Priority Data
Dec. 7, 2007    (JP) ................................ 2007-317060

(51) Int. Cl.
*H04N 5/335*    (2011.01)
(52) U.S. Cl.
USPC .......................................... 348/280; 348/273
(58) Field of Classification Search
None
See application file for complete search history.

(56) References Cited

U.S. PATENT DOCUMENTS 5,557,324 A    9/1996    Wolff
6,236,434 B1   5/2001    Yamada
6,355,939 B1   3/2002    Dodd
(Continued)

FOREIGN PATENT DOCUMENTS

| JP | 10-136391      | 5/1998 |
| JP | 2000-150927    | 5/2000 |
| JP | 2002-094999    | 3/2002 |
| JP | 2005-019958    | 1/2005 |
| JP | 2006-509358    | 3/2006 |
| JP | 2006-254331    | 9/2006 |
| JP | 2007-086720    | 4/2007 |
| WO | 2007/006630 A1 | 1/2007 |

OTHER PUBLICATIONS

International Search Report for corresponding International Application No. PCT/JP2008/003531 mailed Mar. 10, 2009.
Kikuta and Iwata, "Polarized Image Measuring System", Oplus E, vol. 25, No. 11, pp. 1241-1247, 2003.

*Primary Examiner* — Luong T Nguyen
(74) *Attorney, Agent, or Firm* — Renner, Otto, Boisselle & Sklar, LLP

(57) ABSTRACT

An image processing apparatus according to the present invention includes a single-chip color image capture element that has a color mosaic filter 201 and a patterned polarizer 202 in which a number of polarizer units, having polarization transmission planes defining at least three different angles, are provided for multiple pixels of the same color (G) in the color mosaic filter 201. This apparatus includes not only a color and polarization obtaining section 101 including such a single-chip color image capture element but also a polarization information processing section 103 for approximating, as a sinusoidal function, a relation between the intensities of light rays that have been transmitted through the polarizer units for the G pixels and the angles of the polarization transmission planes of the polarizer units and a color mosaic interpolation section 102 for generating a color intensity image by performing a color intensity interpolation and getting a color intensity that cannot be obtained at a pixel of interest.

10 Claims, 24 Drawing Sheets

(56) References Cited

U.S. PATENT DOCUMENTS

| | | | |
|---|---|---|---|
| RE37,752 E * | 6/2002 | Wolff | 348/207.99 |
| 7,149,262 B1 * | 12/2006 | Nayar et al. | 375/341 |
| 7,414,630 B2 * | 8/2008 | Schweng et al. | 345/589 |
| 7,522,278 B2 * | 4/2009 | Kaminsky | 356/364 |
| 7,710,484 B2 * | 5/2010 | Oda | 348/320 |
| 7,834,917 B2 * | 11/2010 | Kinoshita et al. | 348/241 |
| 8,130,293 B2 * | 3/2012 | Kanamori et al. | 348/280 |
| 2005/0133879 A1 | 6/2005 | Yamaguti et al. | |
| 2005/0233493 A1 | 10/2005 | Augusto | |

* cited by examiner

FIG. 3
| POLARIZER #1 (G1, ETC.) | POLARIZER #2 (G2, ETC.) | POLARIZER #3 (G3, ETC.) |
|---|---|---|
| MAIN AXIS ANGLE $\phi = 0°$ | MAIN AXIS ANGLE $\phi = 60°$ | MAIN AXIS ANGLE $\phi = 120°$ |
| 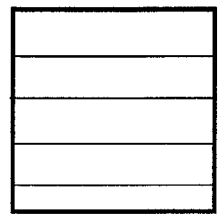 | 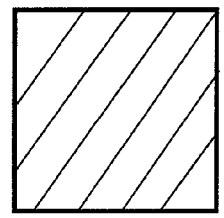 | 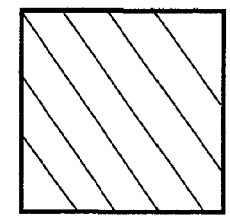 |

*FIG. 4*
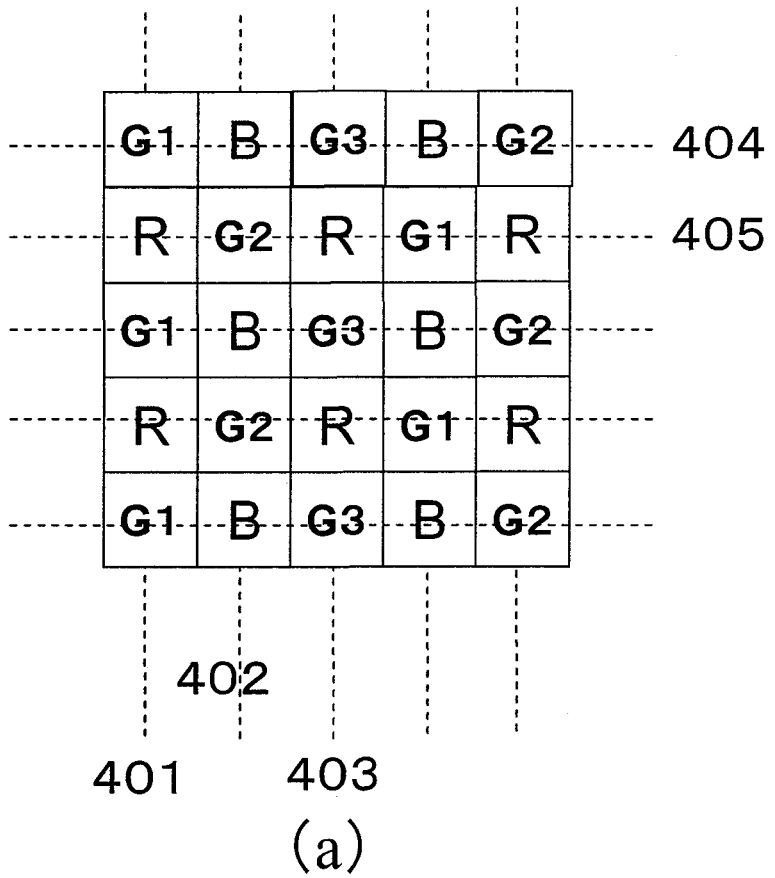
(a)
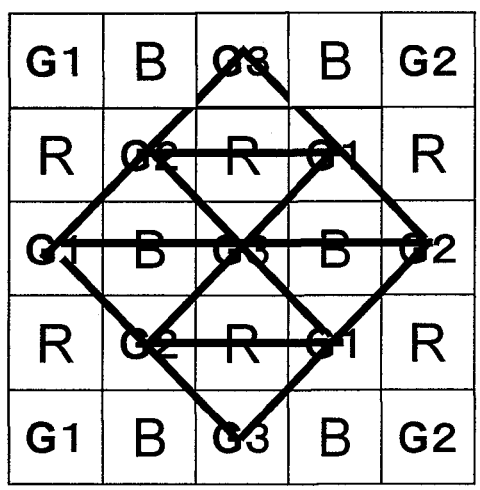
(b)

*FIG. 5*
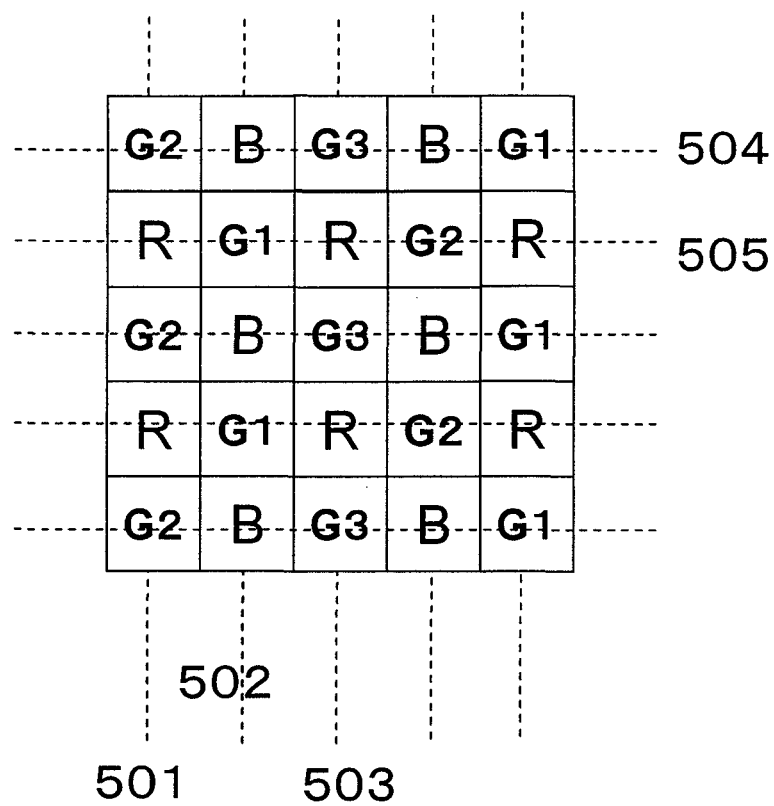
(a)
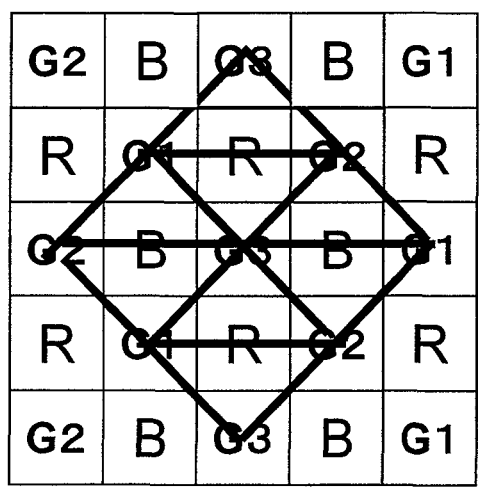
(b)

FIG. 13
(a)
OBJECT (BALL)
(b)
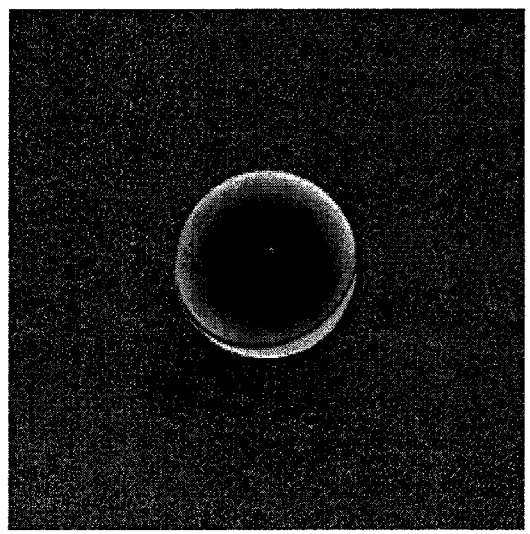
DEGREE-OF-
POLARIZATION IMAGE
$\rho(x,y)$
(c)
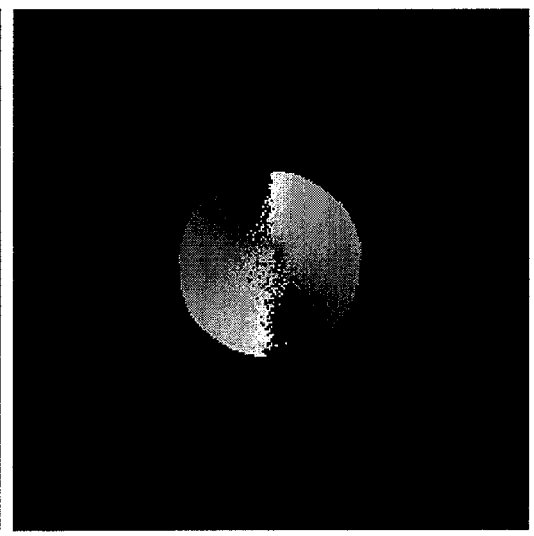
POLARIZATION PHASE
IMAGE $\phi(x,y)$

*FIG. 15*
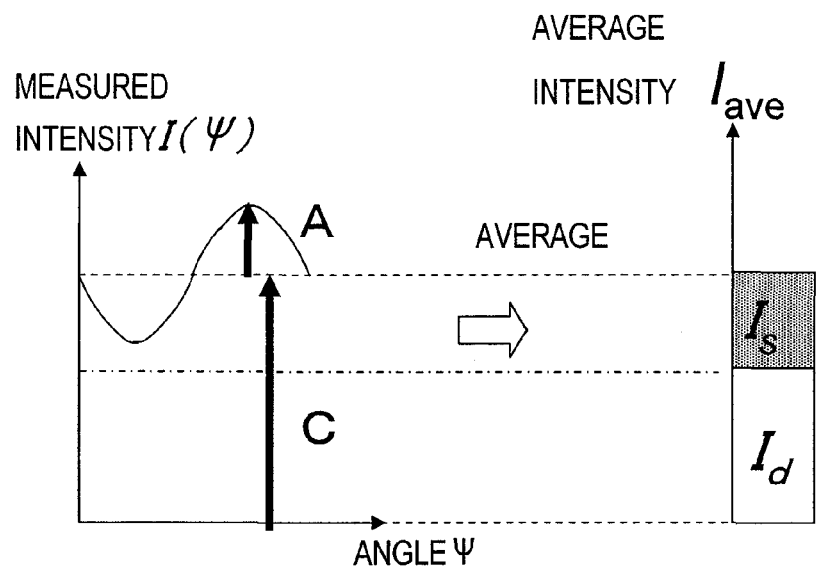
(a)
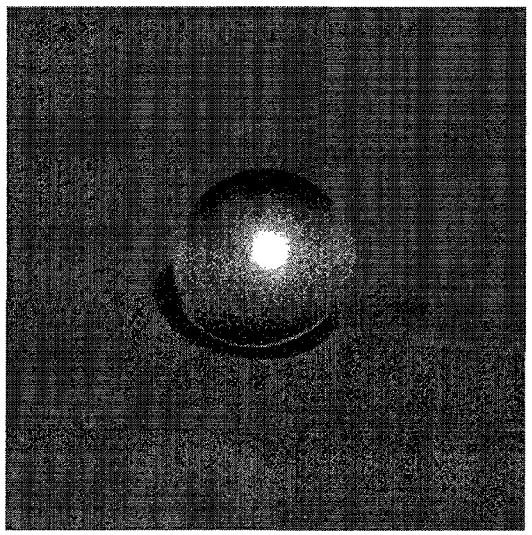
(b)
SPECULAR
REFLECTION
IMAGE
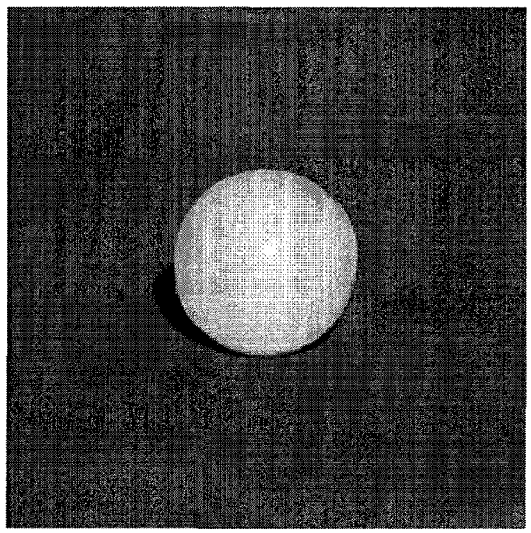
(c)
DIFFUSE
REFLECTION
IMAGE

*FIG. 24*

| G1 | R1 | G1 | R1 | G1 | R1 | G1 | R1 |
|----|----|----|----|----|----|----|----|
| B1 | G2 | B1 | G2 | B1 | G2 | B1 | G2 |
| G1 | R1 | G1 | R1 | G1 | R1 | G1 | R1 |
| B1 | G2 | B1 | G2 | B1 | G2 | B1 | G2 |
| G1 | R1 | G1 | R1 | G1 | R1 | G1 | R1 |
| B1 | G2 | B1 | G2 | B1 | G2 | B1 | G2 |
| G1 | R1 | G1 | R1 | G1 | R1 | G1 | R1 |
| B1 | G2 | B1 | G2 | B1 | G2 | B1 | G2 |

IMAGE PROCESSING DEVICE, IMAGE PROCESSING METHOD, AND IMAGING DEVICE USING A PATTERNED POLARIZER

TECHNICAL FIELD

The present invention relates to an image processing apparatus and method that allows the user to obtain both color information and polarization information from an object at the same time. The present invention also relates to an image capture device that can be used effectively for such image processing.

BACKGROUND ART

Recently, digital movie cameras have advanced so dramatically that it is expected that cellphones with a camera would achieve as high definition as an HDTV in the near future. However, if the size of an optical system or an image capture element were reduced significantly, then the basic performance of the imaging device would decline too much to maintain the minimum required level in terms of sensitivity or diffraction limit of lens. For that reason, such a high-resolution trend should hit a plateau sooner or later. Even so, however, the image quality can still be improved by compensating for the lack of image information of the object by computer graphics type processing. Nevertheless, for that purpose, pieces of physical information, including information about the three-dimensional shape of the object and information about the light source to illuminate the object, need to be collected during the image generation process. To obtain information about the shape of the object, an active sensor for projecting either a laser beam or a light beam emitted from an LED (light-emitting diode) onto the object or a rangefinder system such as a differential stereo vision system is needed. However, such a sensor or system is not just bulky but also imposes various restrictions. For example, such a sensor or system allows a distance of at most several meters between the camera and the object. Besides, such a sensor or system cannot be used unless the object is a solid and bright diffusive object. Under such a restriction, the sensor or system cannot be used to shoot an object located at a distance outdoors or take a close up photo of a person with his or her hair and clothes shot as beautifully as possible.

To sense the shape of a completely passive object, polarization may be used according to some conventional technique. This technique takes advantage of the fact that the light reflected (which may be either specular reflected or diffuse reflected) from an object irradiated with non-polarized natural light will have various types of partial polarization due to geometrical factors such the surface direction and the viewpoint. To collect those sorts of information, however, the degrees of partial polarization of the respective pixels of the object should be obtained in the form of polarized images.

Patent Document No. 1 and Non-Patent Document No. 1 disclose that a patterned polarizer with multiple different polarization main axes is spatially arranged in an image capture element in order to obtain light intensity images and images representing the degrees of partial polarization of the object. As the patterned polarizer, either a photonic crystal or a form-birefringent micro retarder array may be used. According to these techniques, however, just a monochrome image and a polarized image can be obtained at the same time.

Patent Document No. 2 teaches arranging a polarization filter for some of G (green) pixels in a Bayer color mosaic, thereby giving polarization property to a part of an image capture element and obtaining a color image and polarization information at the same time. According to this technique, an image with reduced specular reflection components is obtained from a color image. However, since a difference between two different polarization pixels is simply calculated according to this technique, information about the degree of partial polarization of the object cannot be obtained perfectly.

Patent Document No. 1: Japanese Patent Application Laid-Open Publication No. 2007-86720
Patent Document No. 2: Japanese Patent Application Laid-Open Publication No. 2006-254331
Non-Patent Document No. 3: Kikuta and Iwata, "Polarized Image Measuring System", Oplus E, Vol. 25, No. 11, pp. 1241-1247, 2003

DISCLOSURE OF INVENTION

Problems to be Solved by the Invention

However, according to none of the conventional techniques described above, a color image of the object and a polarized image representing the partial polarization of the object can be obtained at the same time. Thus, it has been impossible to obtain a color moving picture and shape information with no time lag left between them.

In Patent Document No. 2, a color image is controlled with parts of polarization information added to the color image, thereby reducing the specular reflection. According to this technique, pixels are arranged as a Bayer mosaic as shown in FIG. 24, in which G1 and G2 both denote G pixels and in which polarizer units are arranged at the G1 locations but are not arranged at the G1 locations. Meanwhile, R1 and B1 denote R (red) pixels and B (blue) pixels, respectively, and no polarizer units are provided for these pixel locations. That is to say, in this pixel arrangement, only the G2 pixels function as polarization pixels.

In the processing performed by the apparatus of Patent Document No. 2, the difference in light intensity between the G1 and G2 pixel locations is multiplied by a constant and the product is added to non-polarization pixels R1, G1 and B1. In this manner, the color intensity value can be controlled. According to this configuration, although a color image and polarization information can be obtained, polarizer units are arranged at the G2 pixel locations, and therefore, those G2 pixels are different from original ones. As a result, if color mosaic interpolation were carried out as it is, the resultant color image will have some degree of color difference.

On top of that, as just two types of polarization pixels are used, the partial polarization information obtained is so imperfect that it is not clear what degree of partial polarization has been produced in what direction at each pixel location. That is to say, an image with perfect polarization information cannot be obtained.

It is therefore an object of the present invention to provide an apparatus and method for image processing that can obtain not only a full-color image, of which the color mosaic has been interpolated correctly, but also a polarized image representing the direction and degree of polarization at the same time.

Another object of the present invention is to provide an image capture device that can be used effectively for such image processing.

Means for Solving the Problems

An image processing apparatus according to the present invention includes: a color and polarization obtaining section including a single-chip color image capture element that has a color mosaic filter and a patterned polarizer in which a number of polarizer units, having polarization transmission planes defining at least three different angles, are provided for multiple pixels of the same color in the color mosaic filter; a polarization information processing section for approximating, as a sinusoidal function, a relation between the intensities of light rays that have been transmitted through the polarizer units for the multiple pixels of the same color and the angles of the polarization transmission planes of the polarizer units; and a color mosaic interpolation section for generating a color intensity image using a triangular area as a pixel unit by performing a color intensity interpolation. The triangular area is comprised of three polarizer units that have polarization transmission planes defining mutually different angles and that are adjacent to each other.

In one preferred embodiment, the patterned polarizer has a structure in which three types of polarizer units, having polarization transmission planes defining mutually different angles, are arranged adjacent to each other.

In another preferred embodiment, the color mosaic filter has a structure in which pixels in a single particular color are arranged in a checkerboard pattern, and the polarizer units are provided for those pixels that are arranged in the checkerboard pattern.

In still another preferred embodiment, the color mosaic filter has a structure defined by rotating a square lattice, in which pixels in a single particular color are arranged in a checkerboard pattern, 45 degrees, and the polarizer units are provided for those pixels that are arranged in the checkerboard pattern.

In this particular preferred embodiment, each said pixel has an octagonal shape.

In a specific preferred embodiment, the single particular color is G (green) among R (red), G (green) and B (blue).

In yet another preferred embodiment, the color mosaic filter has a hexagonal lattice structure in which each said pixel has a hexagonal shape, and the polarizer units are provided for the arrangement of those pixels in a single particular color.

In yet another preferred embodiment, the color mosaic interpolation section calculates the average of intensities that have been measured in pixels of the same color, for which three types of polarizer units are provided, in the neighborhood of pixels that need to have their color intensities interpolated, thereby canceling the effect of polarization and performing interpolation on the color intensity. The three types of polarizer units have polarization transmission planes that define angles that are different from each other by 60 degrees.

An image processing method according to the present invention includes the steps of: measuring the intensities of respective pixels using a single-chip color image capture element in which three types of polarizer units, having polarization transmission planes defining mutually different angles, are provided for multiple pixels in a single particular color in a color pixel arrangement; obtaining polarization information based on the intensities that have been measured in the three types of pixels in the single particular color, for which the polarization transmission planes define mutually different angles; and generating a color intensity image by performing a color intensity interpolation using a triangular area as a pixel unit. The triangular area is comprised of three types of pixels in the single particular color, for which the polarization transmission planes define mutually different angles.

An image capture device according to the present invention includes: a color mosaic filter; a patterned polarizer, in which multiple polarizer units that have polarization transmission planes defining three different angles are provided for pixels of the same color in the color mosaic filter; and a single-chip color image capture element for outputting, on a pixel-by-pixel basis, a signal representing the intensity of light that has been transmitted through the color mosaic filter and the patterned polarizer.

In one preferred embodiment, the color mosaic filter has a structure in which pixels in a single particular color are arranged in a checkerboard pattern, and the polarizer units are provided for those pixels that are arranged in the checkerboard pattern.

In another preferred embodiment, the color mosaic filter has a structure defined by rotating a square lattice, in which pixels in a single particular color are arranged in a checkerboard pattern, 45 degrees, and the polarizer units are provided for those pixels that are arranged in the checkerboard pattern.

In a specific preferred embodiment, each said pixel has an octagonal shape.

In another preferred embodiment, the color mosaic filter has a hexagonal lattice structure in which each said pixel has a hexagonal shape, and the polarizer units are provided for the arrangement of those pixels in a single particular color.

Effects of the Invention

According to the present invention, multiple types of polarizer units are used in combination with a pixel arrangement of a color mosaic filter, and therefore, information about a color intensity and information about polarization can be obtained and processed at the same time.

In addition, according to the present invention, a triangular area, which is comprised of three polarizer units that have polarization transmission planes defining mutually different angles and that are adjacent to each other, is used as a pixel unit. That is why compared to a situation where an area comprised of four or more polarizer units that have polarization transmission planes defining mutually different angles is used as a pixel unit, more localized and more accurate polarization information can be obtained from a pixel unit with a smaller planar area.

BRIEF DESCRIPTION OF DRAWINGS

FIG. 3 illustrates the three types of polarization main axes of a polarizer unit.

FIGS. 4(a) and 4(b) illustrate an exemplary combined arrangement for a color filter and patterned polarizer according to a first preferred embodiment of the present invention.

FIGS. 5(a) and 5(b) illustrate another exemplary combined arrangement for a color filter and patterned polarizer according to the first preferred embodiment.

FIG. 13(a) is an input image representing a plastic ball as a spherical object, and FIGS. 13(b) and 13(c) show an exemplary degree-of-polarization image ρ (x, y) and an exemplary polarization phase image φ (x, y) with respect to the object shown in FIG. 13(a).

FIGS. 15(a) through 15(c) illustrate how an image may be separated into an image composed of reflection components and an image composed of diffuse reflection components.

FIG. 24 illustrates a prior art.

Figure 1:
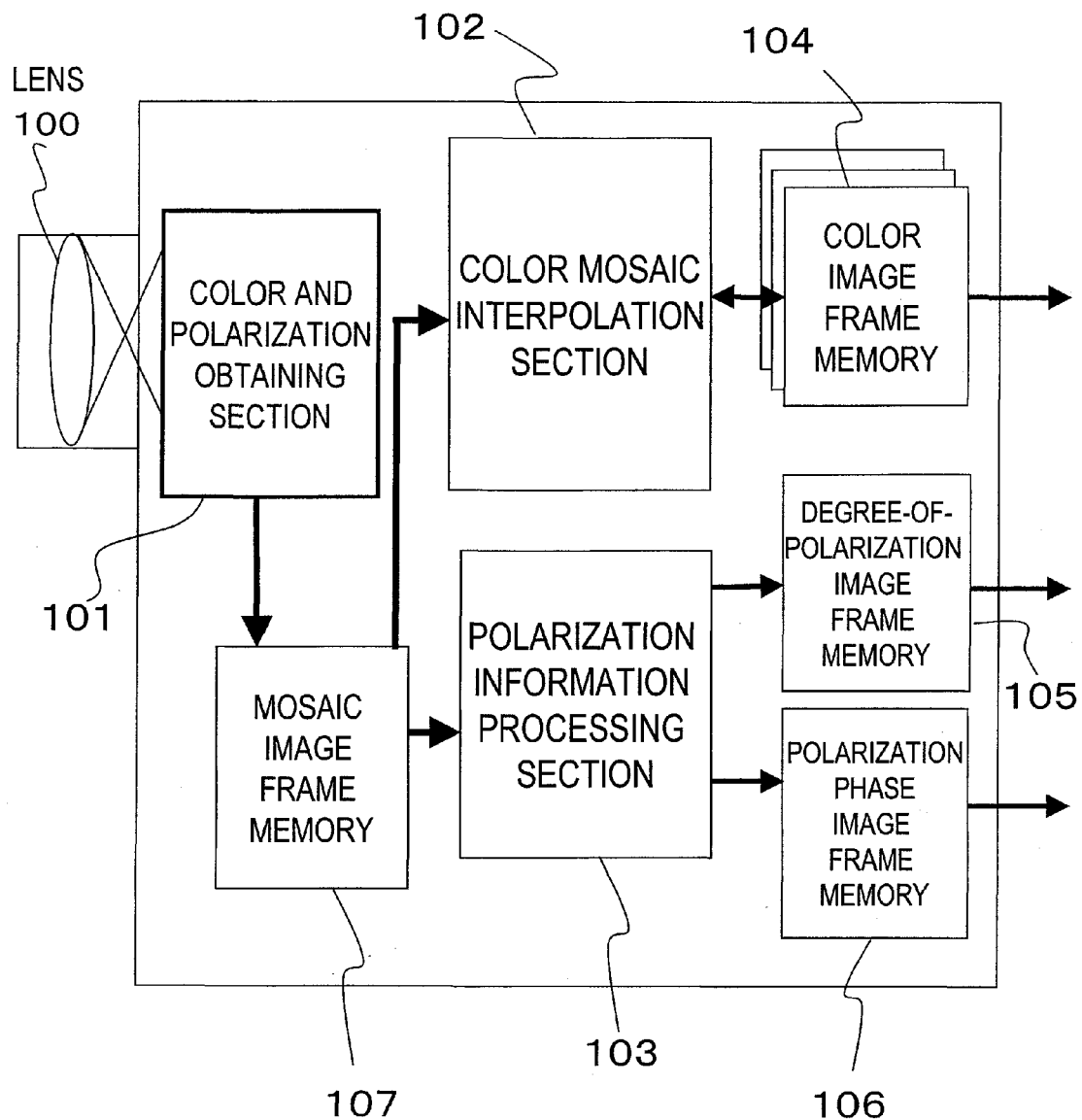
FIG. 1 is a block diagram illustrating a configuration for an image processing apparatus according to the present invention.

DESCRIPTION OF REFERENCE NUMERALS 100 lens
101 color and polarization obtaining section.
102 color mosaic interpolation section
103 polarization information processing section
104 color image frame memory
105 degree-of-polarization image frame memory
106 polarization phase image frame memory
107 mosaic image frame memory

BEST MODE FOR CARRYING OUT THE INVENTION

Hereinafter, embodiments of an apparatus and method for image processing according to the present invention will be described with reference to the accompanying drawings. The preferred embodiments of the present invention to be described below generally have the following arrangements:

EMBODIMENT 1: three different types of polarizers are provided for only G pixels of a Bayer color mosaic;

EMBODIMENT 2: three different types of polarizers are provided for only G pixels of a Bayer color mosaic that has been rotated 45 degrees; and EMBODIMENT 3: three different types of polarizers are provided for only G pixels of a hexagonal lattice color mosaic arrangement.

Embodiment 1

FIG. 1 is a block diagram illustrating a basic configuration that applies to every preferred embodiment of the present invention to be described herein. The Apparatus of this preferred embodiment obtains not only color image information from an object in real time but also polarized image information at the same time, and outputs those pieces of information as two different types of polarized images (i.e., a degree-of-polarization image ρ and a polarization phase image φ). Each of the degree-of-polarization image ρ and the polarization phase image φ could be either a still picture or a moving picture.

After having passed through the lens 100 shown in FIG. 1, the incident light enters a color and polarization obtaining section 101. From this incident light, the color and polarization obtaining section 101 can obtain data about a color moving picture and data about a polarization information image at the same time. The data about the color mosaic image is output from the color and polarization obtaining section 101 and stored in a mosaic image frame memory 107.

The mosaic image data is sequentially read out from the mosaic image frame memory 107 and then passed to, and subjected to interpolation processing by, a color mosaic interpolation section 102. The results of the interpolation processing are stored in a color image frame memory 104, in which the three planes of R, G and B are provided for each pixel, and are read when necessary.

Meanwhile, pixel signals are also read sequentially from the mosaic image frame memory 107 and supplied to a polarization information processing section 103. These pixel signals are processed by the polarization information processing section 103 and then stored in a degree-of-polarization image frame memory 105 and a polarization phase image frame memory 106. The degree-of-polarization image frame memory 105 outputs data about the degree-polarization image (ρ) and the polarization phase image frame memory 106 outputs data about the polarization phase image (φ).

Figure 2:
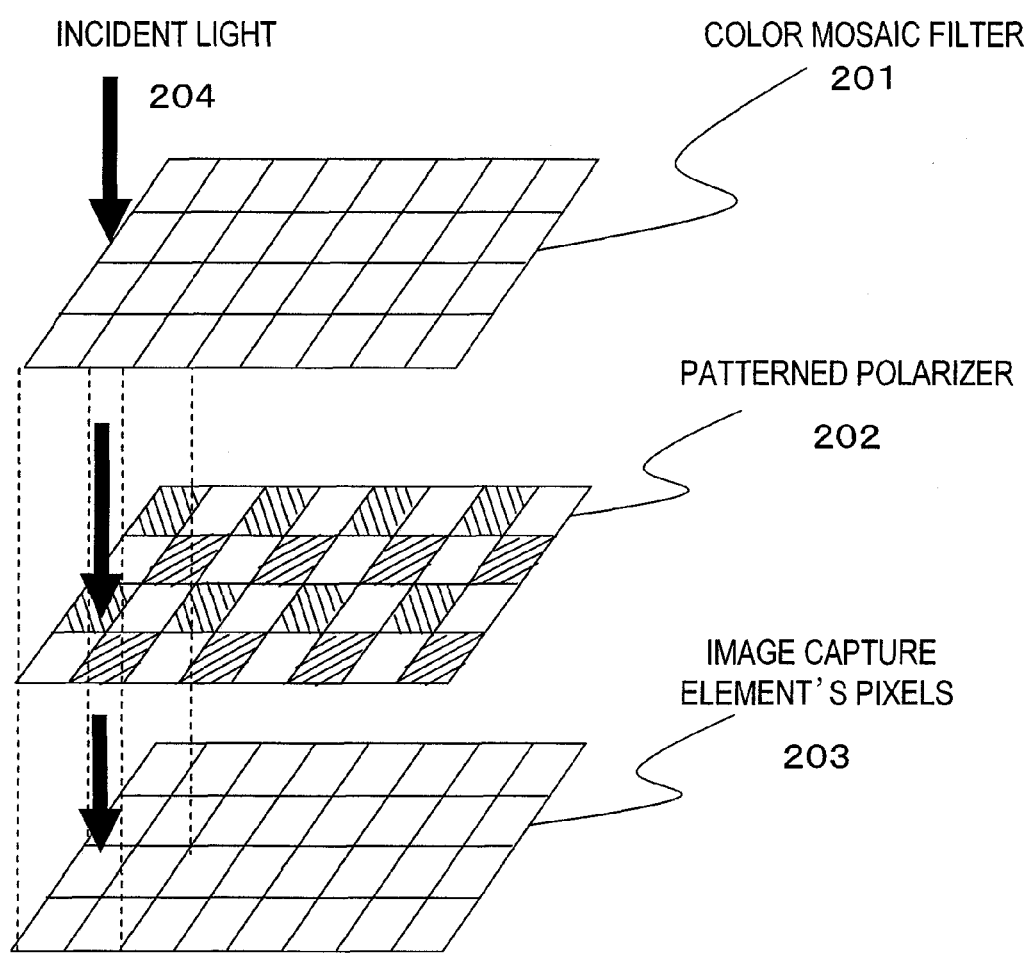
FIG. 2 illustrates an arrangement for the color and polarization obtaining section.

FIG. 2 is a schematic representation illustrating a basic arrangement for the color and polarization obtaining section 101. In the example illustrated in FIG. 2, a color mosaic filter 201 and a patterned polarizer 202 are stacked one upon the other in front of image capture element's pixels 203. However, as FIG. 2 just illustrates a general concept, the color mosaic filter 201 and the patterned polarizer 202 may also be stacked in reverse order. That is to say, the patterned polarizer 202 may be stacked on the front side of the color mosaic filter 201 contrary to FIG. 2. Also, if an optical element that has both the color filter function and the polarization function alike is used, then these two functions are realized by itself, and therefore, there is no need to stack them in the first place.

The incident light 204 is transmitted through the color mosaic filter 201 and the patterned polarizer 202 to reach the image capture element and have its intensity monitored by the image capture element's pixels 203 on a pixel-by-pixel basis. Thus, according to this preferred embodiment, color information and polarization information can be obtained at the same time using a single-chip color image capture element. As will be described in detail later, the patterned polarizer 202 consists of a lot of polarizer units including ones (or segments), of which the polarization transmission planes define mutually different angles. Each of those polarizer units typically has a size corresponding to one pixel. However, there is no need to provide the polarizer unit for every pixel of the color mosaic filter 201. In this patterned polarizer 202, those polarizer units are arranged in a checkerboard pattern.

Such a patterned polarizer 202 may be realized by using the photonic crystal disclosed in Non-Patent Document No. 1, for example. When the photonic crystal is used, light, of which the electric field vector oscillating plane is parallel to the groove that has been cut on its surface, becomes a TE wave (transverse electric wave, of which the electric field components are transverse with respect to the incident plane), and light, of which the electric field vector oscillating plane is perpendicular to the groove on its surface, becomes a TM wave (transverse magnetic wave, of which the magnetic field components are transverse with respect to the incident plane). And each polarizer unit exhibits such a polarization property as to transmit the TM wave and reflect (not transmit) the TE wave in each wavelength range.

FIG. 3 shows the meanings of oblique lines that are schematically drawn on each polarizer unit of the patterned polarizer 202. Specifically, the oblique lines drawn within each pixel shown in FIG. 3 indicate the polarization main axis direction of a micro-polarizer (i.e., the polarizer unit) that is arranged over that pixel. As used herein, the "polarization main axis" is an axis that is defined parallel to the polarization plane (i.e., polarization transmission plane) of the light to be transmitted through a polarizer.

Each polarizer unit transmits light, of which the oscillation plane is parallel to the main-axis direction of the polarizer unit, and cuts off light, of which the oscillation plane is perpendicular to the main-axis direction of the unit. In this description, polarization main axes with angles ψ=0, 60, and 120 degrees are allocated to the polarizer units with polarizer numbers 1 through 3, respectively. As the polarized light transmittance of each polarizer unit depends on the wavelength of the light to use, the polarizer unit is designed according to the transmission wavelength range of the color mosaic filter. For example, the polarizer unit identified by the reference sign G1 is designed so as to transmit polarized light, of which the main axis direction is "1" (i.e., the angle ψ=0 degrees), in the "G" wavelength range.

FIG. 4 illustrates the arrangement of pixels in the color and polarization obtaining section 101 of this preferred embodiment. In FIG. 4(a), three types of polarizer units G1, G2 and G3 are provided for only G pixel locations in a Bayer color mosaic filter. In this example, if attention is paid to the arrangement of G polarizer units, it can be seen that a column 401 in which G1 polarizer units are arranged vertically, a column 402 in which G2 polarizer units are arranged vertically, and a column 403 in which G3 polarizer units are arranged vertically alternate cyclically in this order. On the other hand, on a row 404, G1, G3 and G2 are horizontally arranged in this order cyclically. On a row 405, G1, G3 and G2 are also arranged in this order cyclically as on the row 404 but the arrangement phase is horizontally shifted by three pixels with respect to the row 404. It should be noted that no polarizer units are arranged at the R and B pixel locations.

In FIG. 4, only 25 (=5×5) pixels are shown. However, a huge number of pixel blocks are actually arranged in the color and polarization obtaining section 101 parallel to the image capturing plane so that multiple sets, each consisting of 25 pixel blocks and each having the same arrangement pattern as the one shown in FIG. 4, are arranged cyclically. On the other hand, FIG. 4(b) illustrates multiple triangular pixel sets (G1-G2-G3). As each triangular area, of which the vertices are defined by three adjacent G pixels, is actually a very small area and as the polarization information can be regarded as identical within that triangular area, the following polarization information is obtained based on the intensities measured at those three polarizer units. That is to say, each triangle is used as a fundamental unit for obtaining polarization information. That is why in this description, each of those triangular areas G1-G2-G3 is supposed herein to be a virtual triangular pixel set, which is different from pixels that function as physical light receiving units on the image capture element's plane. As the pixel arrangement itself on the image capturing plane is a square lattice according to this preferred embodiment, each virtual triangular pixel set has an isosceles triangular shape.

FIG. 5 illustrates another exemplary arrangement of pixels in the color and polarization obtaining section 101 of this preferred embodiment. In this arrangement, a column 501 in which G2 polarizer units are arranged vertically, a column 502 in which G1 polarizer units are arranged vertically, and a column 503 in which G3 polarizer units are arranged vertically alternate cyclically in this order. On the other hand, on a row 504, G2, G3 and G1 are horizontally arranged in this order cyclically. On a row 505, G2, G3 and G1 are also arranged in this order cyclically as on the row 504 but the arrangement phase is horizontally shifted by three pixels with respect to the row 504. Each triangular pixel set G1-G2-G3 has the same structure as in the arrangement shown in FIG. 4.

<Polarization Information>

Figure 6:
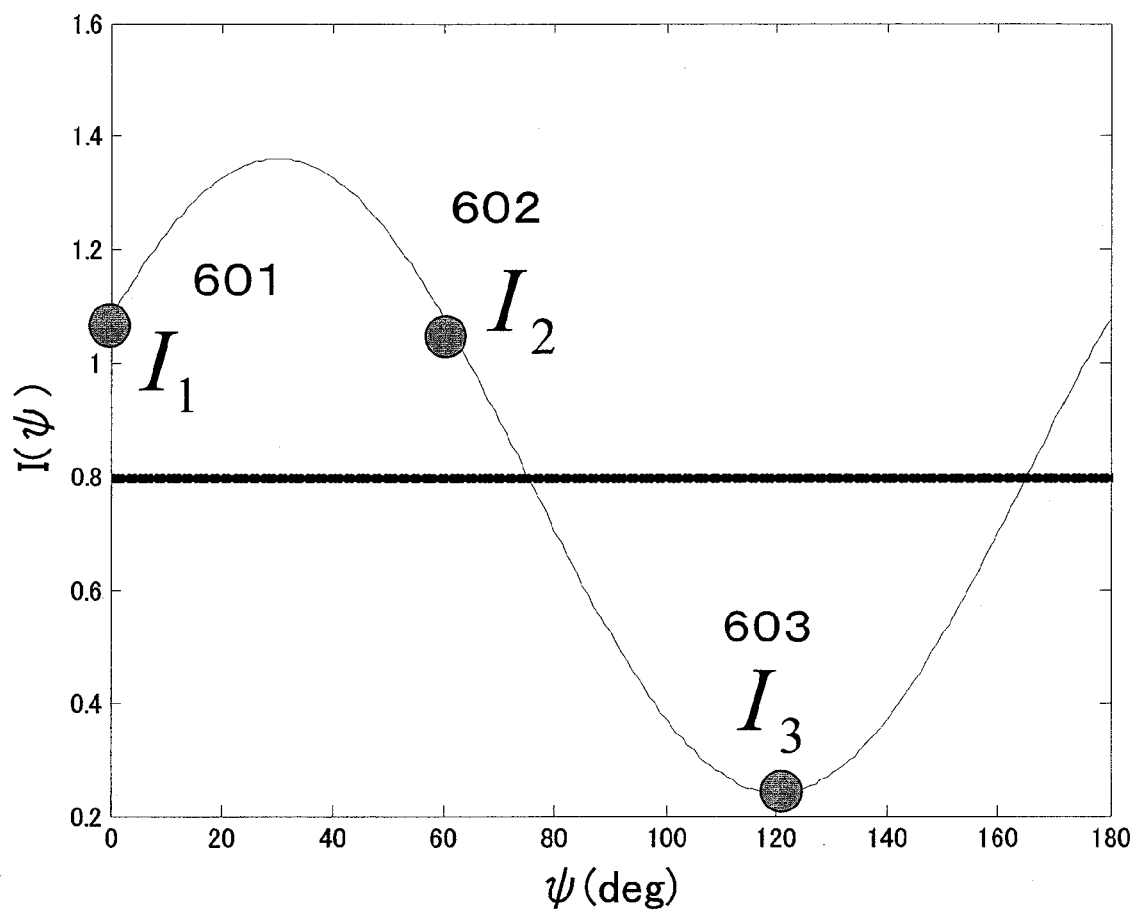
FIG. 6 shows an intensity variation that looks like a sinusoidal function and measuring intensity points in the first preferred embodiment.

FIG. 6 shows the intensities 601 through 603 of G light rays that have been transmitted through three types of polarizers, of which the polarization main axes (with Ψi=0, 60, and 120 degrees, respectively) are defined in three different directions. In this example, if the angle of rotation ϕ of the polarization main axis is $\phi_i$, then the intensity measured will be identified by $I_i$, where i is an integer that falls within the range of 1 to N and N is the number of samples. In the example shown in FIG. 6, N=3, and therefore, i=1, 2 or 3. In FIG. 6, the intensities 601 through 603 associated with the three G pixel samples ($\phi_i$, $I_i$) are shown. The relation between the angle Ψi of the polarization main axis and the intensities 601 through 603 is represented by a sinusoidal function with a period π (180 degrees). A sinusoidal function with a fixed period has only three kinds of unknowns, i.e., amplitude, phase and average. That is why by measuring the three intensities 601 to 603 at mutually different ψ, a single sinusoidal curve can be determined completely.

The intensity measured on a polarizer unit with respect to the polarization main axis angle ψ is represented by the following Equation (1):

$$I(\psi) = A \cdot \sin 2(\psi - B) + C \quad (1)$$

Figure 7:
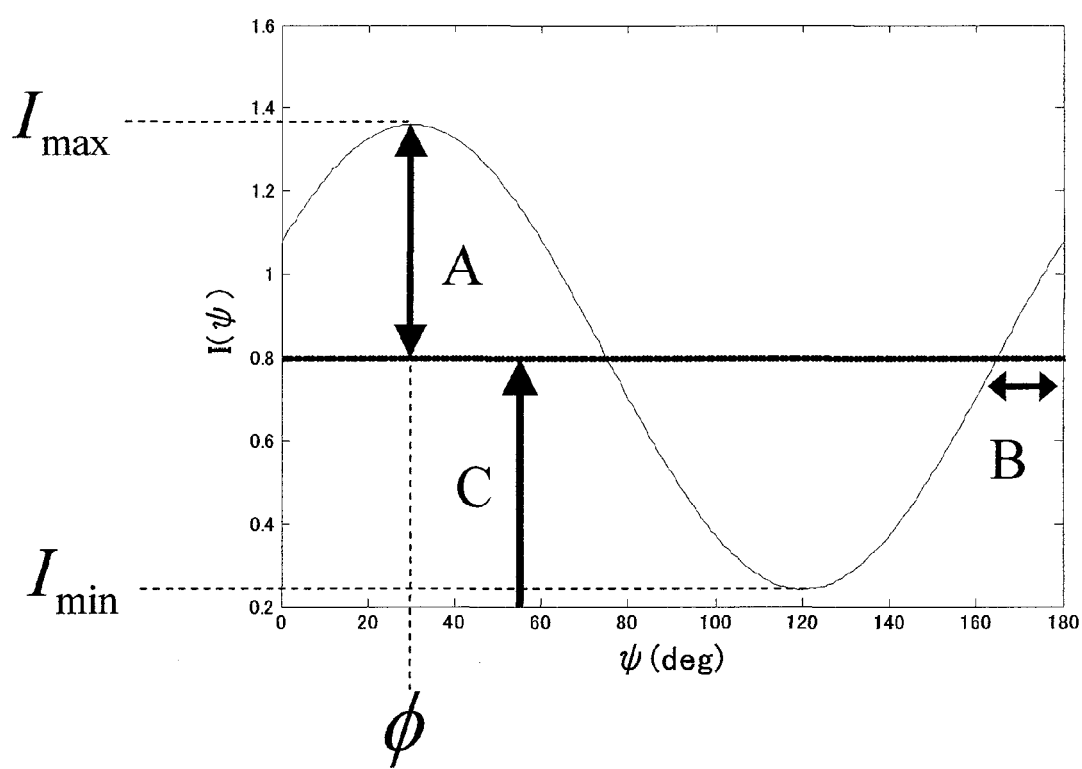
FIG. 7 shows the three unknown parameters of a sinusoidal function according to the first preferred embodiment.

In this case, A, B and C are unknown constants as shown in FIG. 7 and respectively represent the amplitude, phase and average of the curve showing a variation in polarized light intensity. By making measurements at three points, Equation (1) can be expanded into the following simultaneous equations (2):

$$\begin{cases} I_1 = -A\sin(2B) + C \\ I_2 = A\sin\left(\frac{2\pi}{3} - 2B\right) + C = A\left[\frac{\sqrt{3}}{2}\cos(2B) + \frac{1}{2}\sin(2B)\right] + C \\ I_3 = A\sin\left(\frac{4\pi}{3} - 2B\right) + C = A\left[-\frac{\sqrt{3}}{2}\cos(2B) + \frac{1}{2}\sin(2B)\right] + C \end{cases} \quad (2)$$

The unknown C is the average of the intensities of polarization pixels that have an even phase difference, and therefore, can be determined by the following Equation (3):

$$C = \frac{I_1 + I_2 + I_3}{3} \quad (3)$$

Also, by solving the simultaneous equations (2), A and B can be determined by the following Equations (4) and (5), respectively:

$$A = \frac{2}{3}\sqrt{(I_1^2 + I_2^2 + I_3^2 - I_1 I_2 - I_2 I_3 - I_3 I_1)} \quad (4)$$

$$B = \frac{1}{2}\tan^{-1}\left(\frac{I_2 + I_2 - 2I_1}{\sqrt{3}(I_2 - I_3)}\right) \quad (5)$$

As used herein, the "polarization information" means information about the degree of modulation of the amplitude ρ of such a sinusoidal curve, representing the fluctuation of the intensity according to the angle of the polarization main axis, and the phase information φ thereof. By performing these processing steps, the three parameters A, B and C of the sinusoidal function are determined on a triangular area G1-G2-G3 basis. In this manner, a degree-of-polarization image representing the degree of polarization p and a polarization phase image representing the polarization phase φ can be obtained for each pixel. Specifically, the degree of polarization ρ represents how much the light in a pixel of interest has been polarized, while the polarization phase φ represents an angular position at which the sinusoidal function has the maximum value. This angle represents the angle of a plane, including a surface normal to the object, within an image plane in a situation where the light reflected from the object has produced internal diffuse reflection. It should be noted that the polarization main axis angles of 0 and 180 degrees (π) are the same as each other.

The values ρ and φ (where 0≤φ≤π) are calculated by the following Equations (6) and (7), respectively:

$$\rho = \frac{I_{max} - I_{min}}{I_{max} + I_{min}} = \frac{A}{C} \quad (6)$$

$$\phi = \frac{\pi}{4} + B \quad (7)$$

It should be noted that if the degree polarization and the polarization phase are obtained on a triangular area G1-G2-G3 basis, then it means that the images stored in the degree-of-polarization image frame memory 105 and the polarization phase frame memory 106 also have a triangular pixel structure.

<Interpolation of G Color Intensity>

Figure 8:
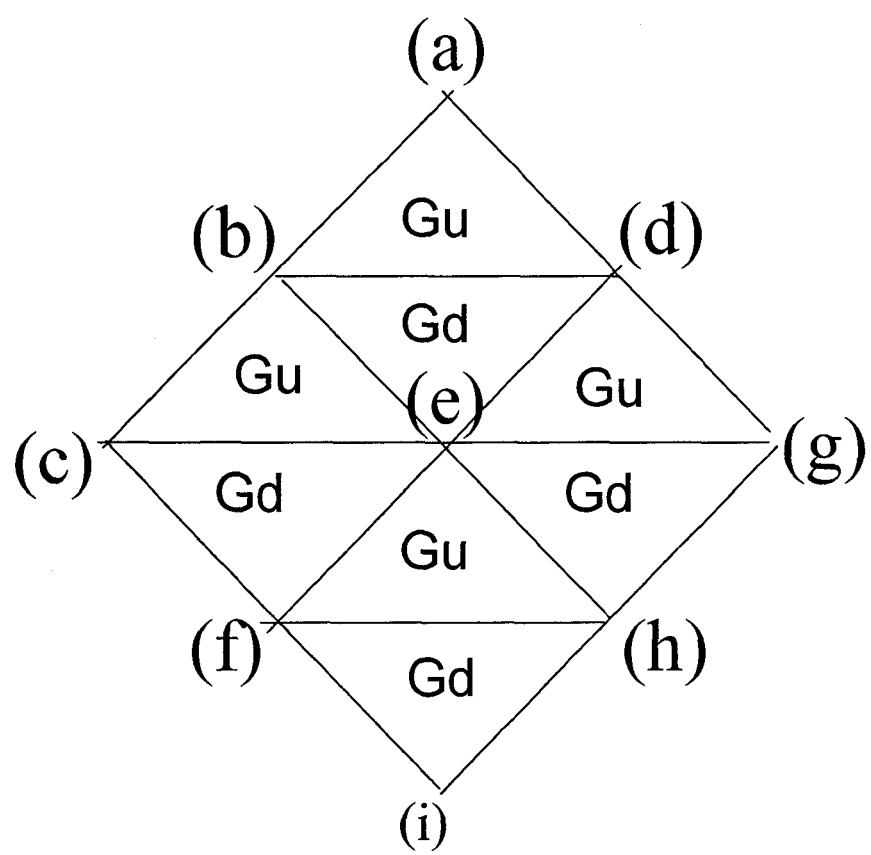
FIG. 8 illustrates a set of triangular areas and how to perform interpolation on the G color intensity according to the first preferred embodiment.
Figure 9:
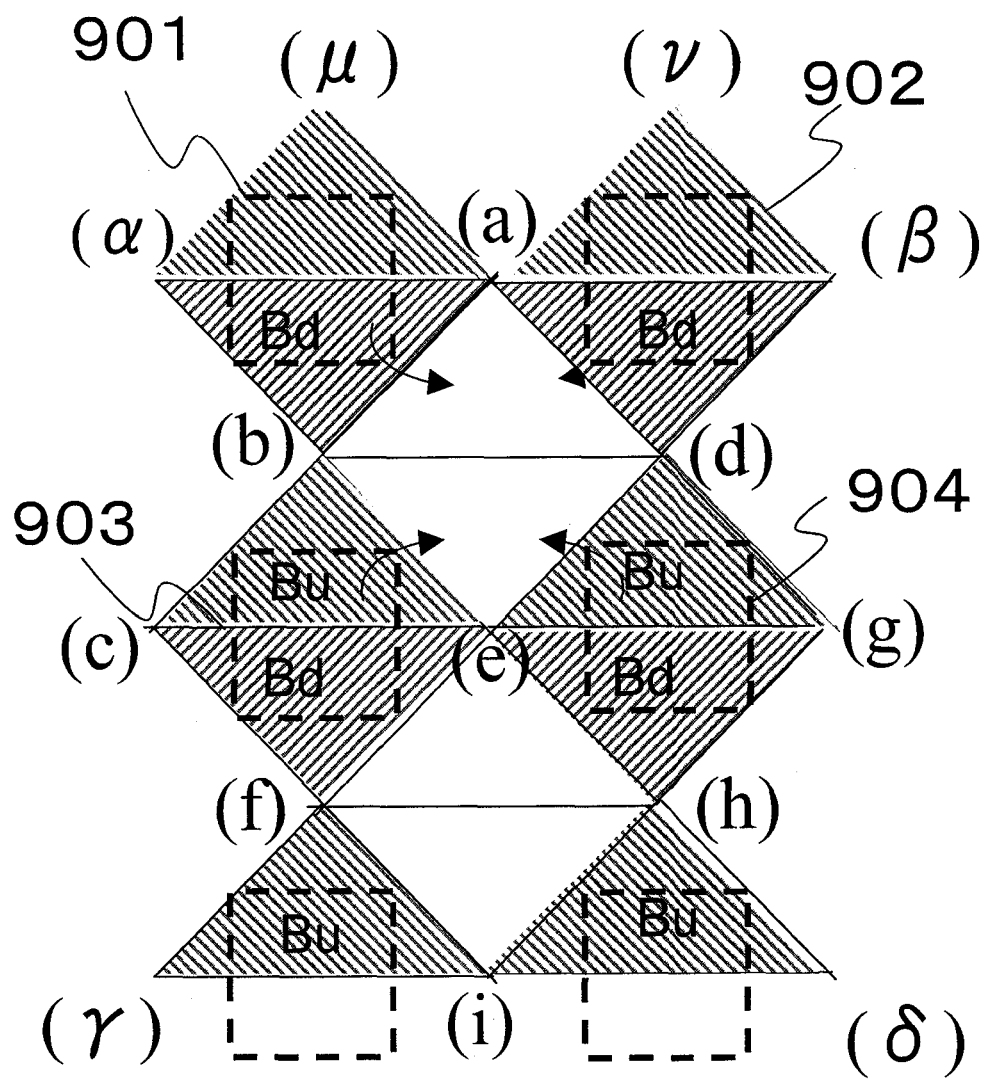
FIG. 9 illustrates a set of triangular areas and how to perform interpolation on the B color intensity according to the first preferred embodiment.

FIG. 8 illustrates the eight triangular pixel sets shown in FIG. 4(b) or 5(b). Vertices (a) through (i) of these triangles are associated with nine pixels, each of which is one of the three G polarization pixels G1, G2 and G3. In a preferred embodiment of the present invention, the color intensity interpolation is also carried out on a triangular pixel set basis as shown in FIG. 9. $G_u$, which is the G intensity of the triangle (a)(b)(d) defined by splitting the oblique square (a)(b)(e)(d) shown in FIG. 8 into upper and lower halves, and $G_d$, which is the G intensity of other triangle (b)(e)(d), are calculated by the following Equations (8) and (9), respectively:

$$G_U = \frac{2(I_a + I_b + I_d)}{3T} \quad (8)$$

$$G_d = \frac{2(I_b + I_d + I_e)}{3T} \quad (9)$$

where $I_a$ through $I_e$ are the intensities measured at the respective vertex pixels.

In Equations (8) and (9), the constant 2 is a correction term to cope with the phenomenon that the intensity of non-polarized light decreases to a half when transmitted through a linear polarizer. Also, in these equations, T denotes the transmittance of the polarizer and needs to be used as a correction term because T is not 100%.

The G intensities $G_u$ and $G_d$ can also be obtained in the same way in every other triangular area shown in FIG. 8. It should be noted that each of these pixels in the triangular area becomes a unit with a single intensity value.

<Interpolation of B Color Intensity>

FIG. 9 illustrates pixels that need to be used to obtain the B color intensities of the triangular pixel sets shown in FIG. 4(b) or 5(b). Each of the nine vertices (a) through (i) shown in FIG. 9 is located at the vertex of its associated triangle and is associated with one of the G polarization pixels 1, and 3. In FIG. 9, shown as pixel locations for obtaining necessary data for interpolation are not only four outside vertices (α), (β), (γ) and (δ) of the triangular pixel sets consisting of the vertices (a) through (i) but also two more outside vertices (μ) and (ν).

In FIG. 9, the square areas 901 through 904, which are enclosed with the dashed squares, represent square pixels with B color intensities.

That is to say, B pixels are located within these square areas 901 through 904 and the area of each B pixel accounts for 50% of the overall area of its associated triangular pixel set. This value is also adopted for the upper and lower triangular pixel sets. When this idea is adopted, the B values are present in the shadowed areas shown in FIG. 9. Specifically, the B values are present in the oblique squares (b)(c)(f)(e) and (e)(h)(g)(d) and in the triangles (α)(b)(a), (a)(d)(β), (f)(γ)(i) and (h)(i)(δ).

The triangular areas with missing B intensities are two open triangles that are included in each of the oblique squares (a)(b)(e)(d) and (e)(f)(i)(h). In each of these triangular pixel sets, the B color intensity should be generated by interpolation. For that purpose, the interpolation may be done by working out the average of the B color intensities in the square areas 901 through 904. If the B intensity in the square area 901 is identified by $B_{901}$, for example, the interpolated value can be calculated by the following Equation (10):

$$B = \frac{B_{901} + B_{902} + B_{903} + B_{904}}{4} \quad (10)$$

Nevertheless, each oblique square area needs to be split into two (i.e., upper and lower) triangular pixel sets. By taking advantage of the correlation between B and G color intensities, the B color intensities $B_u$ and $B_d$ are calculated on a triangular pixel set basis by the following Equations (11):

$$B_U = \frac{2G_u}{G_u + G_d} B$$

$$B_d = \frac{2G_d}{G_u + G_d} B \qquad (11)$$

Figure 10:
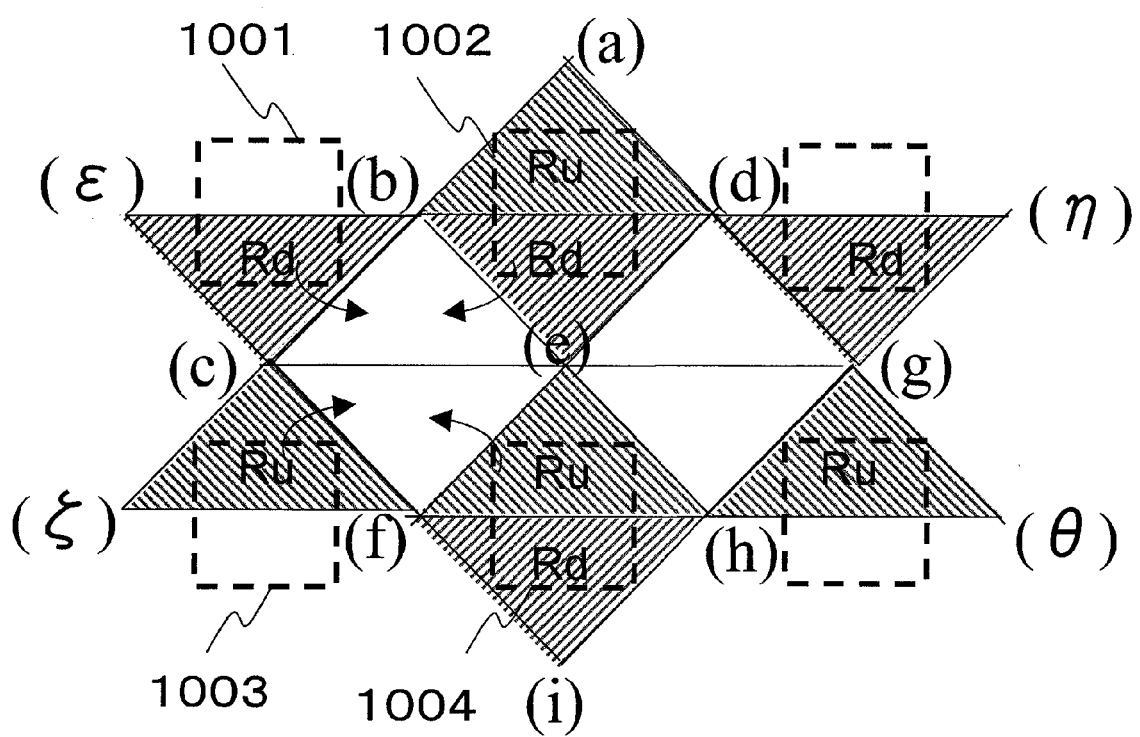
FIG. 10 illustrates a set of triangular areas and how to perform interpolation on the R color intensity according to the first preferred embodiment.

FIG. 10 illustrates pixels that need to be used to obtain the R color intensities of the triangular pixel sets shown in FIG. 4(b) or 5(b). To obtain necessary data for interpolation, four vertices (∈), (ζ), (η) and (θ), which are G pixel locations outside of the triangular pixel sets defined by the vertices (a) through (i), are also drawn. In this case, the R pixels are present in the shadowed areas as in the B pixel described above. Specifically, the R pixels are present in the oblique squares (a)(b)(e)(d) and (e)(f)(i)(h) and in the triangles (∈)(c)(b), (c)(ζ)(f), (d)(g)(η) and (g)(h)(θ).

<Interpolation of R Color Intensity>

FIG. 10 illustrates pixels that need to be used to obtain the R color intensities of the triangular pixel sets shown in FIG. 4(b) or 5(b). To obtain necessary data for interpolation, four vertices (∈), (ζ), (η) and (θ), which are G pixel locations outside of the triangular pixel sets defined by the vertices (a) through (i), are also drawn. In this case, the R pixels are present in the shadowed areas as in the B pixel described above. Specifically, the R pixels are present in the oblique squares (a)(b)(e)(d) and (e)(f)(i)(h) and in the triangles (∈)(c)(b), (c)(ζ)(f), (d)(g)(η) and (g)(h)(θ). As in the interpolation of the B pixels, the triangular pixel sets with no R pixels may be interpolated by the following Equations (12) and (13):

$$R = \frac{R_{1001} + R_{1002} + R_{1003} + R_{1004}}{4} \qquad (12)$$

$$R_u = \frac{2G_u}{G_u + G_d} R$$

$$R_d = \frac{2G_d}{G_u + G_d} R \qquad (13)$$

By performing these processing steps, a degree-of-polarization image, a polarization phase image and an (RGB) full-color intensity image are generated for each of the triangular pixel sets shown in FIG. 4(b) or 5(b).

If the pixel arrangement in the color and polarization obtaining section and the pixel arrangement consisting of triangular pixel sets that form an image are superposed one upon the other, it can be seen that the area of each pair of triangular pixel sets and that of the original square pixel set are equal to each other. If no triangular pixel sets are used, however, the central coordinate position, where the polarization information and the result of the G color intensity interpolation are located, will deviate from the original square lattice coordinate system. As there is a concern about complication of such processing, the triangular pixel sets are adopted in this preferred embodiment.

Hereinafter, it will be described with reference to FIG. 11 how the color mosaic interpolation section 102 shown in FIG. 1 operates.

First of all, the color mosaic image data that has been obtained by the color and polarization obtaining section 101 is supposed to be stored in the mosaic image frame memory 107. In Step S1101, a set of pixels with G intensities (G1-G2-G3) in the mosaic image is read as a unit.

Next, in Step S1102, the G intensity is estimated by interpolation using one of Equations (8) and (9).

Subsequently, in Step S1103, G intensities are stored as a triangular pixel set on the G plane of the color image frame memory 104. Then, in Step S1104, it is determined whether or not every set of pixels with G intensities (G1-G2-G3) has finished being processed. If the answer is NO, then the series of processing steps S1101 through S1104 is performed repeatedly. On the other hand, if the answer to the query of Step S1104 is YES, then the process advances to Step S1105.

Next, in Step S1105, pixels with B intensities and pixels with R intensities are obtained from the mosaic image frame memory, which may be carried out in parallel with each other. The B and R pixel intensities in the triangular pixel set are calculated by Equations (10) and (12), respectively, in Step S1106. Next, in Step S1107, interpolation is carried out on a triangular pixel set with a missing B intensity by Equation (11) and on a triangular pixel set with a missing R intensity by Equation (13), respectively. Thereafter, in Step S1108, the triangular pixel sets with the interpolated B and R intensities are respectively stored on the B and R planes of the color image frame memory 104.

Finally, in Step S1109, it is determined whether or not every pixel with the B or R intensity, stored in the mosaic image frame memory, has finished being processed. If the answer is NO, then the same series of processing steps S1105 through S1109 is carried out all over again.

As a result of these processing steps, data about a color intensity image I (x, y) with (RGB) intensity values of respective pixels is generated in the color image frame memory 104. Although this I (x, y) image has a triangular pixel structure, a full-color image, of which the color reproducibility is comparable to that of a single-chip color image capture element that uses a normal Bayer color mosaic, can still be generated by interpolation.

Next, it will be described with reference to FIG. 12 how the polarization information processing section 103 shown in FIG. 1 operates.

First of all, the color mosaic image data obtained by the color and polarization obtaining section 101 is supposed to be stored in the mosaic image frame memory 107. In Step S1201, a set of pixels with G intensities (G1-G2-G3) is read from the mosaic image frame memory. Then, based on the polarized light intensities G1, G2 and G3, sinusoidal function parameters A, B and C are determined by Equations (2) through (5).

Next, in Step S1203, the degree of polarization ρ and the polarization phase φ are obtained by Equations (6) and (7).

Then, in Step S1204, the values generated are stored at the triangular pixel locations in the degree-of-polarization image frame memory 105 and the polarization phase image frame memory 106.

This series of processing steps is repeatedly carried out until it is determined in Step S1205 that every pixel in the mosaic image frame memory has finished being processed. In this manner, data about the degree-of-polarization image ρ (x, y) is generated in the degree-of-polarization image frame memory 105 and data about the polarization phase image φ (x, y) is generated in the polarization phase image frame memory 106. These images have a triangular pixel structure, which is different from the pixel structure of the color mosaic image, as can be seen from its generation process. As a result, just by providing the patterned polarizer for only G pixels, polarization information can be obtained with the same pixel structure and at the same resolution as a full-color image I (x, y).

Figure 11:
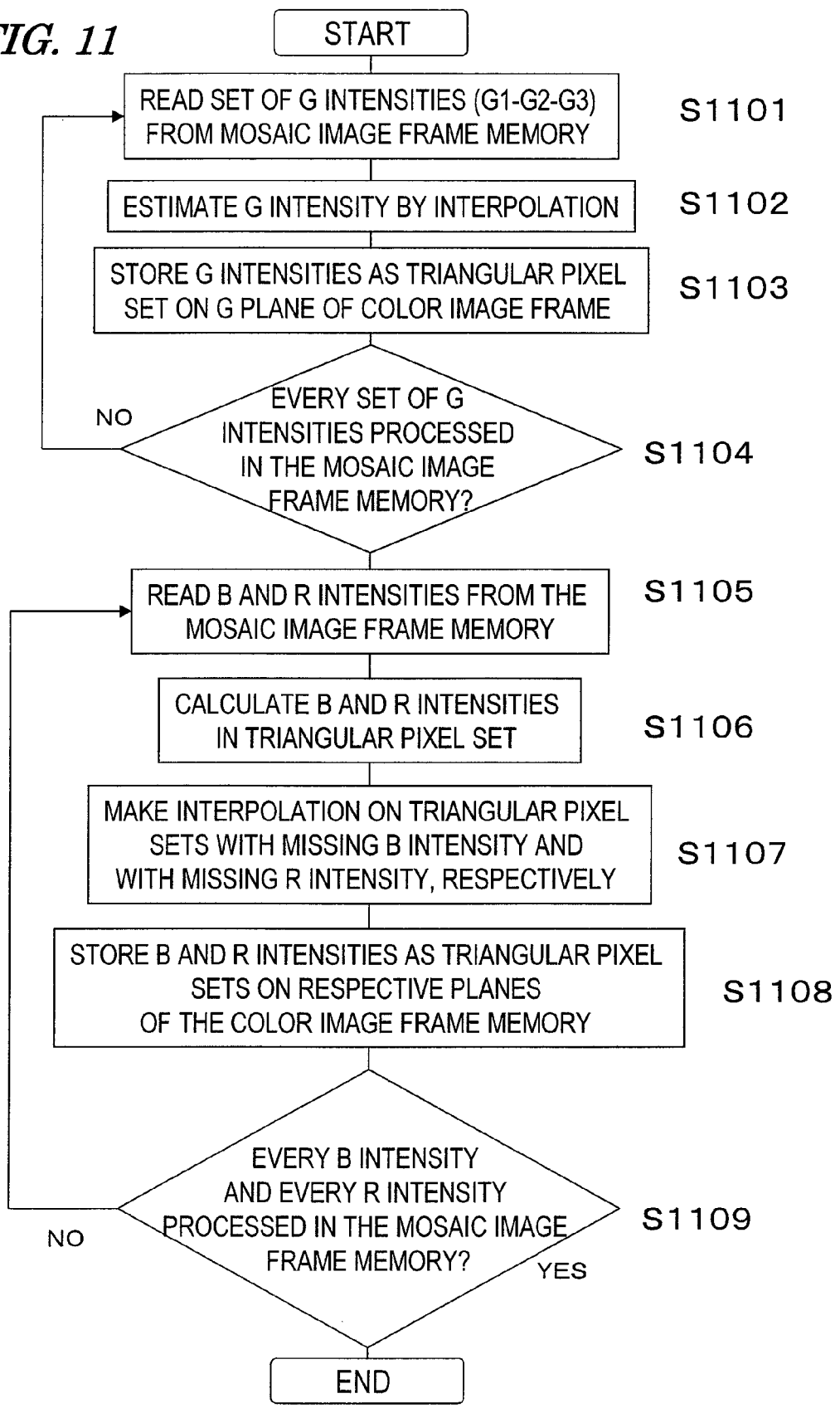
FIG. 11 is a flowchart showing how the color mosaic interpolation section of the first preferred embodiment operates.
Figure 12:
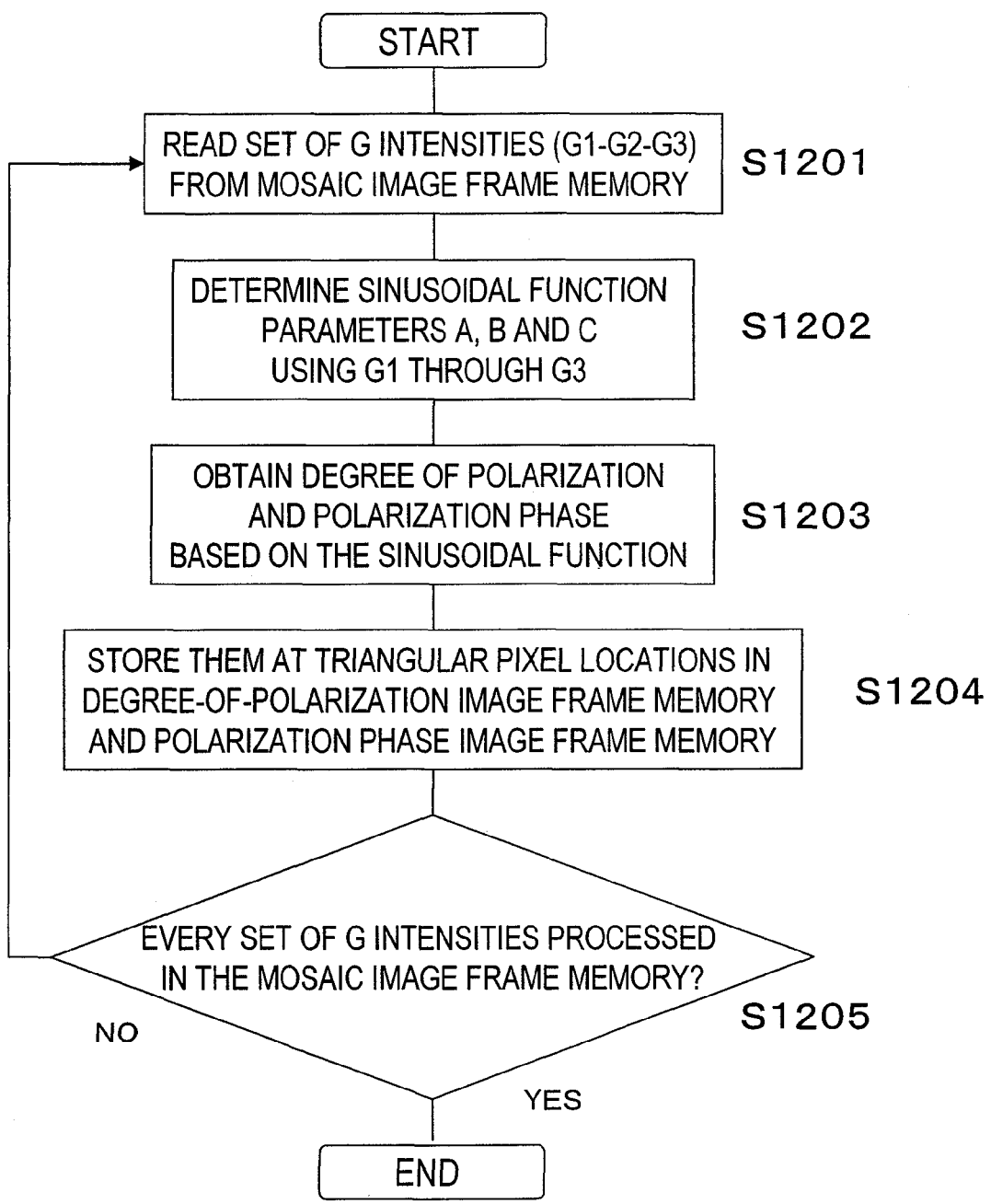
FIG. 12 is a flowchart showing how the polarization information processing section of the first preferred embodiment operates.

The processing procedures shown in FIGS. 11 and 12 are independent of each other, and therefore, may be performed in parallel with each other. Also, these processing procedures may be carried out either by executing a software program or using hardware components.

Furthermore, in the preferred embodiment described above, a patterned polarizer made of photonic crystals is supposed to be used. Alternatively, a film type polarizer, a wire grid type polarizer, or a polarizer operating on any other principle may also be used.

FIG. 13(a) is an input image representing a plastic ball as a spherical object. Meanwhile, FIGS. 13(b) and 13(c) show an exemplary degree-of-polarization image ρ (x, y) and an exemplary polarization phase image φ (x, y) with respect to the object shown in FIG. 13(a). The images shown in FIGS. 13(a) and 13(b) are illustrated so as to increase its lightness as their degree of polarization ρ or polarization phase φ rises.

Figure 14:
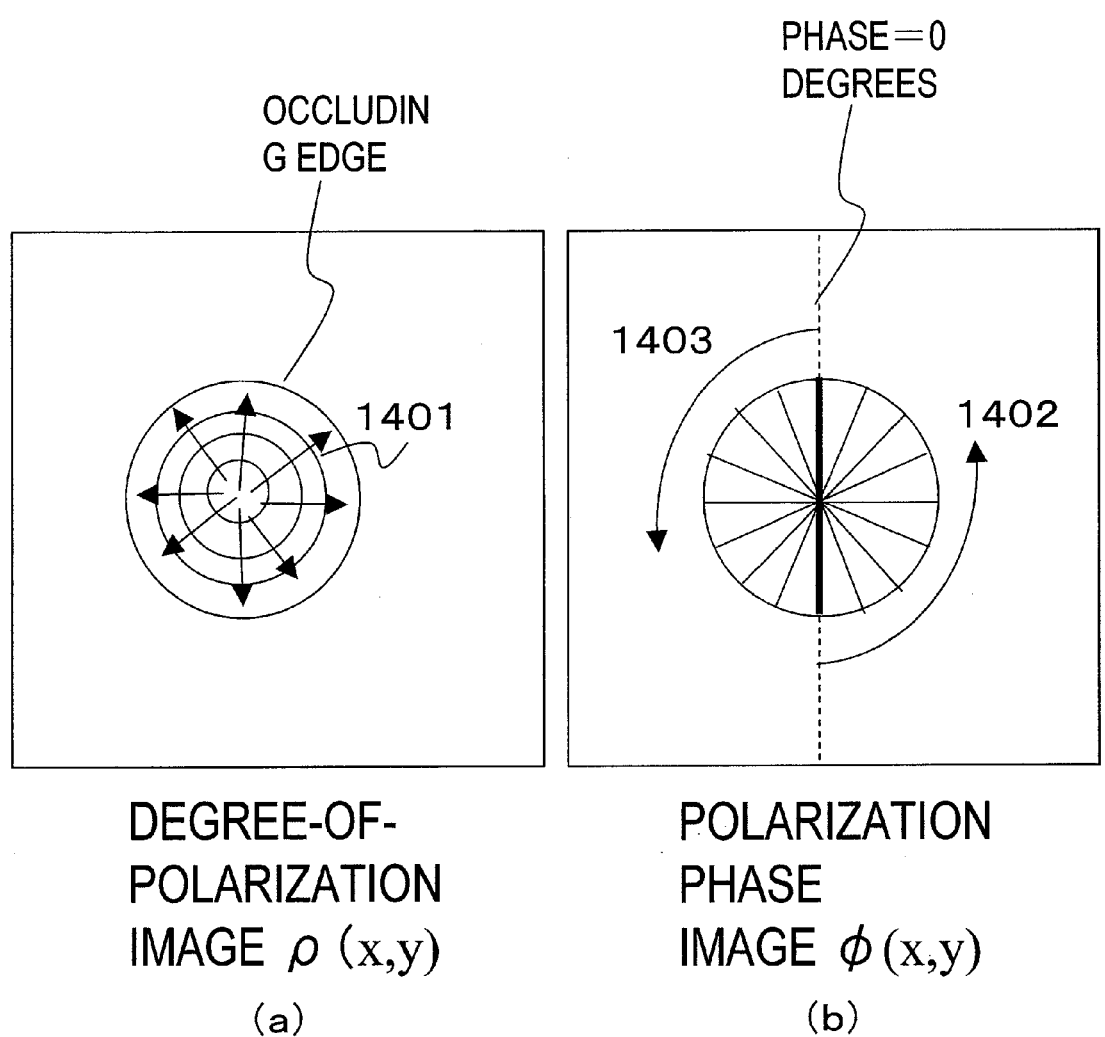
FIGS. 14(a) and 14(b) are schematic representations showing how the numerical values of the object change on the degree-of-polarization image ρ (x, y) and the polarization phase image φ (x, y).

FIGS. 14(a) and 14(b) are schematic representations illustrating the meanings of the images shown in FIGS. 13(b) and 13(c). In the degree-of-polarization image ρ (x, y), the more distant from the approximate center, where the camera's viewing direction agrees with the surface normal defined with respect to the ball, a pixel location becomes in the orientations 1401, the higher the degree of polarization ρ of that pixel. And, in the vicinity of the occluding edge of the ball (i.e., the boundary between the ball and the background) where the surface normal to the ball forms an angle of almost 90 degrees with respect to the camera's viewing direction, the degree of polarization ρ becomes maximum. In FIG. 14(a), these degrees of polarization ρ are schematically represented by contours.

Meanwhile, it can be seen that in the polarization phase image φ (x, y) shown in FIG. 14(b), the polarization phase increases monotonically counterclockwise in the directions indicated by the arrows 1402 and 1403 around the sphere in regular periods of 180 degrees with respect to the perpendicular line representing the vertical direction of the image that indicates that the phase is zero degrees. According to these polarization information images, it can be seen well that the degree of polarization ρ and the polarization phase φ correspond to the directions of the two degrees of freedom of the surface normal to the object. That is to say, the object's shape can be estimated based on the polarization information.

In this preferred embodiment, a degree-of-polarization image and a polarization phase image are supposed to be output based on the diffuse reflection components of the light reflected from the object. However, these images may also be output based on the specular reflection components thereof. In that case, the polarization phases φ are different by 90 degrees from the ones described above.

Also, the polarization information does not have to be the combination (ρ, φ) described above but may also be any other combination of pieces of information as long as those pieces of information are obtained based on the sinusoidal function shown in FIG. 7 or may even be images generated based on those pieces of information. For example, it is important to separate diffuse and specular reflection components of the dielectric object from the polarization information when applying this technique. To carry out this in the present invention, the sinusoidal function parameters A and C are used.

FIG. 15(a) illustrates the relation between a specular reflection component and a diffuse reflection component using a variation in sinusoidal function. Supposing the partial polarization ratio (Specular PFR) of specular reflection with a certain refractive index and an angle of incidence of illumination as determined by Fresnel's reflection formula is r, $$\frac{G_S + A}{G_S - A} = r \tag{14}$$

is satisfied because polarization information is obtained from the G color components. That is why based on this equation, the color intensity specular reflection components can be obtained by the following equations:

$$G_S = \left(\frac{r+1}{r-1}\right)A$$

$$R_S = \left(\frac{G_S}{G}\right)R \tag{15}$$

$$B_S = \left(\frac{G_S}{G}\right)B$$

Examples of images generated in this manner are shown in FIGS. 15(b) and 15(c).

Embodiment 2

Hereinafter, a second preferred embodiment of an image processing apparatus according to the present invention will be described.

The basic configuration of this preferred embodiment is also the same as what is shown in the block diagram of FIG. 1, and therefore, FIG. 1 will also be referred to when necessary.

Figure 16:
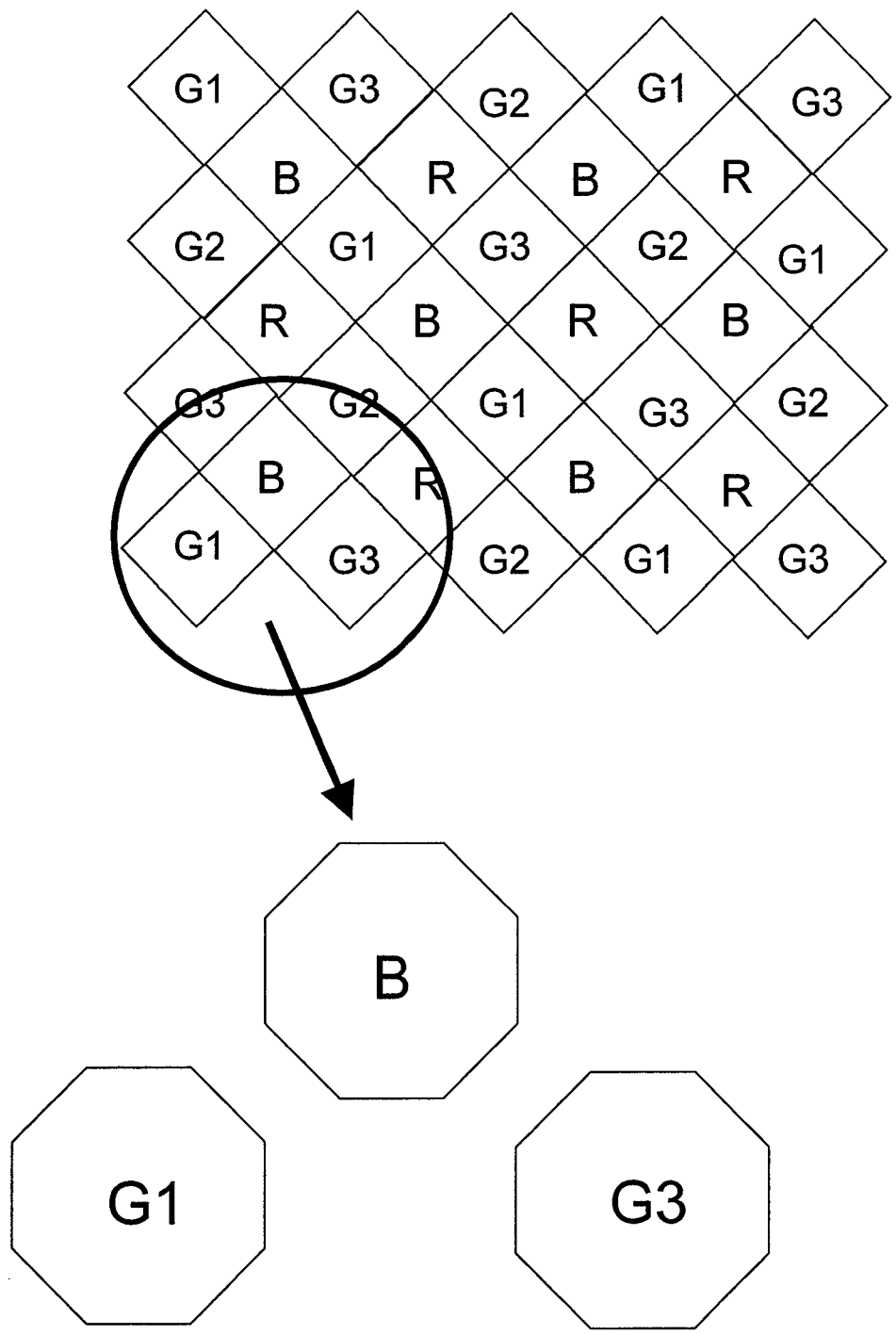
FIG. 16 illustrates an exemplary combined arrangement for a color filter and a patterned polarizer and the shapes of unit pixels according to a second preferred embodiment of the present invention.

FIG. 16 illustrates the arrangement of pixels in the color and polarization obtaining section 101 of this preferred embodiment. The image processing apparatus of this preferred embodiment is characterized by using a different color filter arrangement from that of the first preferred embodiment. Specifically, this color filter arrangement is equivalent to an arrangement obtained by rotating the Bayer type square lattice arrangement shown in FIG. 4 or 5 45 degrees. That is to say, the feature of the Bayer arrangement, in which one R pixel and one B pixel are arranged for each set of two G pixels, is maintained. Each pixel may have an octagonal shape, instead of the square shape, in order to increase the photosensitive area. In FIG. 16, three pixels G1, B and G3 are schematically illustrated on a larger scale as typical examples of octagonal pixels.

By adopting the pixel arrangement shown in FIG. 16, the interpolated color image, the degree-of-polarization image and the polarization phase image can have an upright pixel arrangement structure, and therefore, an image can be generated so as to be easily processed.

In the example illustrated in FIG. 16, the three types of polarizer units G1, G2 and G3 are arranged for only G pixels but no polarizer units are provided at R and B pixel locations. In FIG. 16, only 32 pixels are shown. However, a huge number of pixel blocks are actually arranged in the color and polarization obtaining section 101 parallel to the image capturing plane so that multiple sets, each consisting of 32 pixel blocks and each having the same arrangement pattern as the one shown in FIG. 16, are arranged cyclically.

Figure 17:
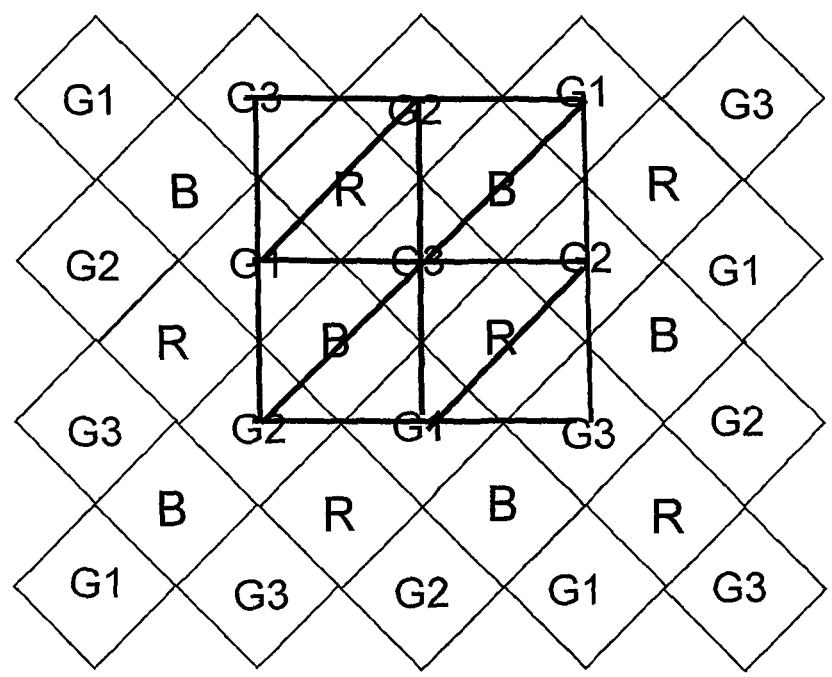
FIG. 17 illustrates a set of triangular areas and an interpolating method according to the second preferred embodiment.

FIG. 17 illustrates multiple triangular pixel sets (G1-G2-G3). As the polarization information can be regarded as identical within each of these triangular areas, the polarization information described above is obtained based on the intensities measured at those three polarizer units. As in the first preferred embodiment described above, each triangle is used as a fundamental unit for obtaining polarization information and making color intensity interpolation. As the actual interpolation processing and a flowchart for use to carry out the processing are just as already described for the first preferred embodiment, the description thereof will be omitted herein. The pixel structure eventually obtained will be a square lattice as shown in FIG. 17. Since the slanted pixel structure of the first preferred embodiment can turned upright according to this preferred embodiment, an easily processable structure can be obtained.

Embodiment 3

Hereinafter, a third preferred embodiment of an image processing apparatus according to the present invention will be described.

The basic configuration of this preferred embodiment is also the same as what is shown in the block diagram of FIG. 1, and therefore, FIG. 1 will also be referred to when necessary.

Figure 18:
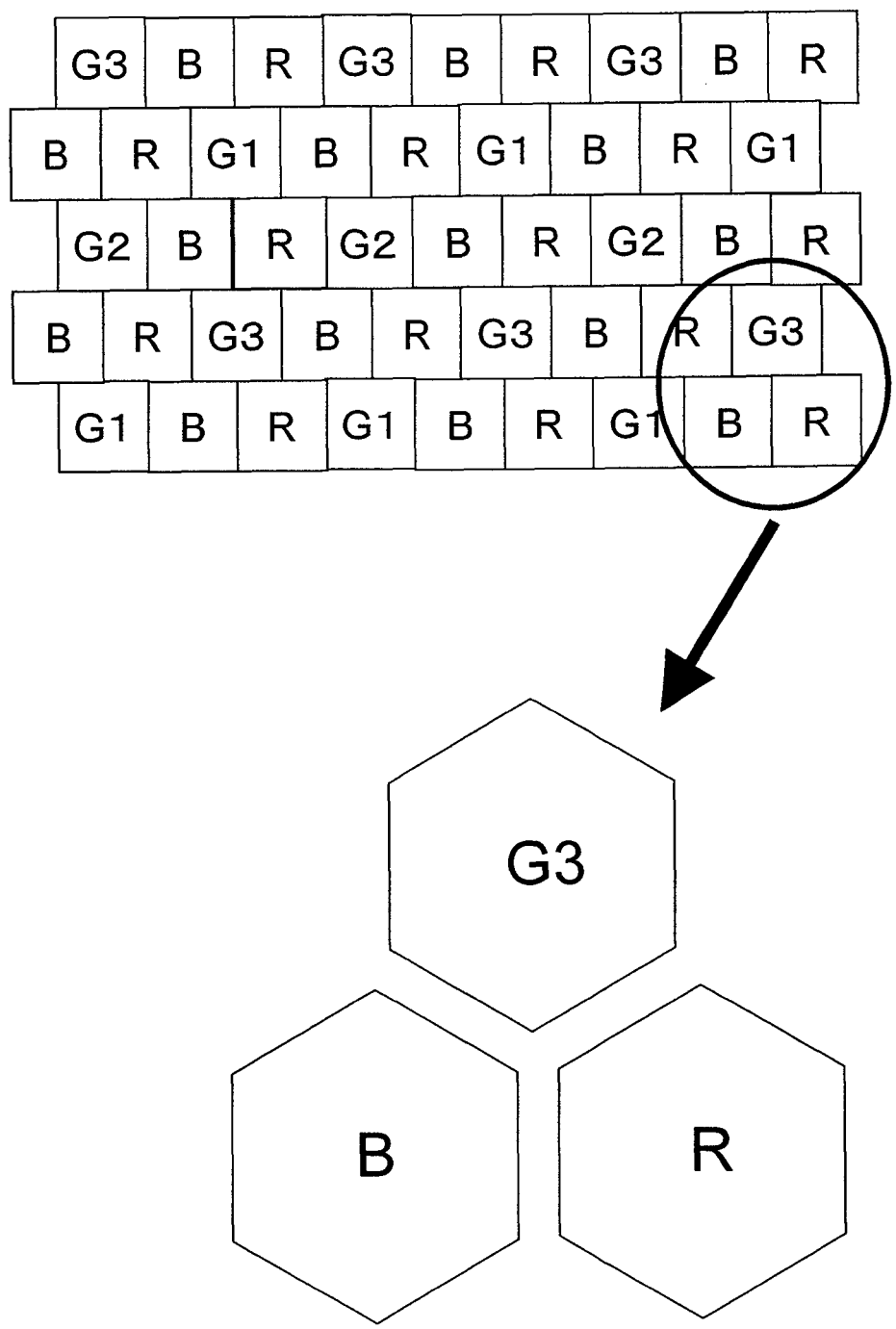
FIG. 18 illustrates an exemplary combined arrangement for a color filter and a patterned polarizer and the shapes of unit pixels according to a third preferred embodiment of the present invention.

FIG. 18 illustrates the arrangement of pixels in the color and polarization obtaining section 101 of this preferred embodiment. The image processing apparatus of this preferred embodiment is characterized in that a color filter arrangement as a fundamental unit for adding the patterned polarizer is different from the counterparts of the first and second preferred embodiments in the following respects:

1) the arrangement of this preferred embodiment is based on a hexagonal lattice, not the square lattice, which means that each pixel is shifted by a half pitch from its neighbors; and 2) G, B and R pixels appear at the same frequency of occurrence.

Using such a color mosaic filter as a fundamental unit, the three types of polarizer units G1, G2 and G3 are provided for only G pixels. In FIG. 18, only 45 (=9×5) pixels are shown. However, a huge number of pixel blocks are actually arranged in the color and polarization obtaining section 101 parallel to the image capturing plane so that multiple sets, each consisting of 45 pixel blocks and each having the same arrangement pattern as the one shown in FIG. 18, are arranged cyclically.

Each pixel may have a hexagonal shape, instead of the square shape, in order to use the photosensitive area more efficiently. In FIG. 18, three pixels B, G3 and R are schematically illustrated on a larger scale as typical examples of hexagonal pixels.

In the arrangement shown in FIG. 18, the shape of each triangle as a unit for collecting information is closer to an equilateral triangle than in the first and second preferred embodiments described above, and therefore, information collected from the three types of polarization pixels is less biased than in the first and second preferred embodiments, which is beneficial.

Figure 19:
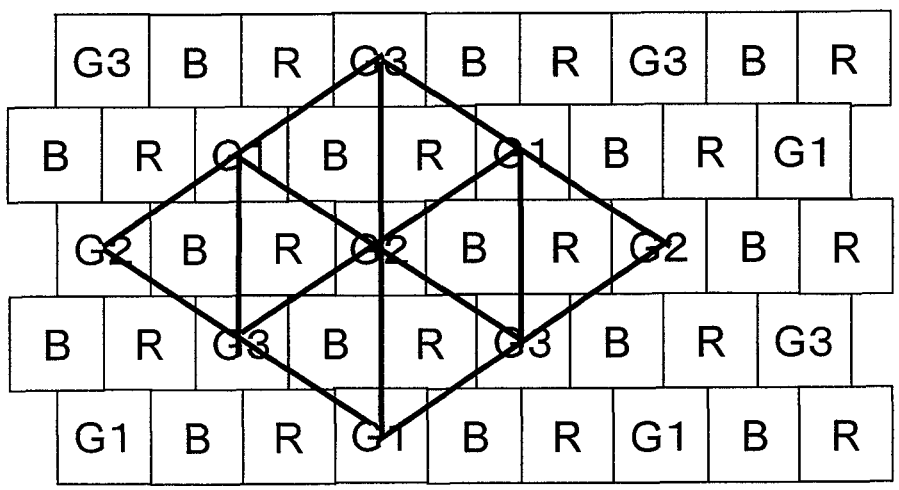
FIG. 19 illustrates a set of triangular areas according to the third preferred embodiment.

FIG. 19 illustrates triangular pixel sets G1-G2-G3. The lengths of the three sides of each of these isosceles triangles are given by the following Equation (16):

$$\left[2, \frac{\sqrt{13}}{2}, \frac{\sqrt{13}}{2}\right] \approx [1.00, 0.901, 0.901] \tag{16}$$

On the other hand, those of the three sides of each triangle of the first and second preferred embodiments are given by the following Equation (17):

$$[\sqrt{2}, 1, 1] \approx [1.00, 0.707, 0.707] \tag{17}$$

As the polarization information can be regarded as identical within each of those local triangular areas, the following polarization information can be obtained based on the intensities measured at those three polarizer units. As in the first and second preferred embodiments described above, each triangle is used as a fundamental unit for obtaining polarization information and making color intensity interpolation.

<Polarization Information>

As can be seen from the arrangement shown in FIG. 19, a single piece of polarization information can be obtained from a triangular area that contains three different kinds of polarization information about only the color G. As already described in detail for the previous preferred embodiments, a degree-of-polarization image and a polarization phase image can also be obtained according to this preferred embodiment with the plane supposed to be a collection of triangular pixel sets.

<G Color Intensity Interpolation>

Figure 20:
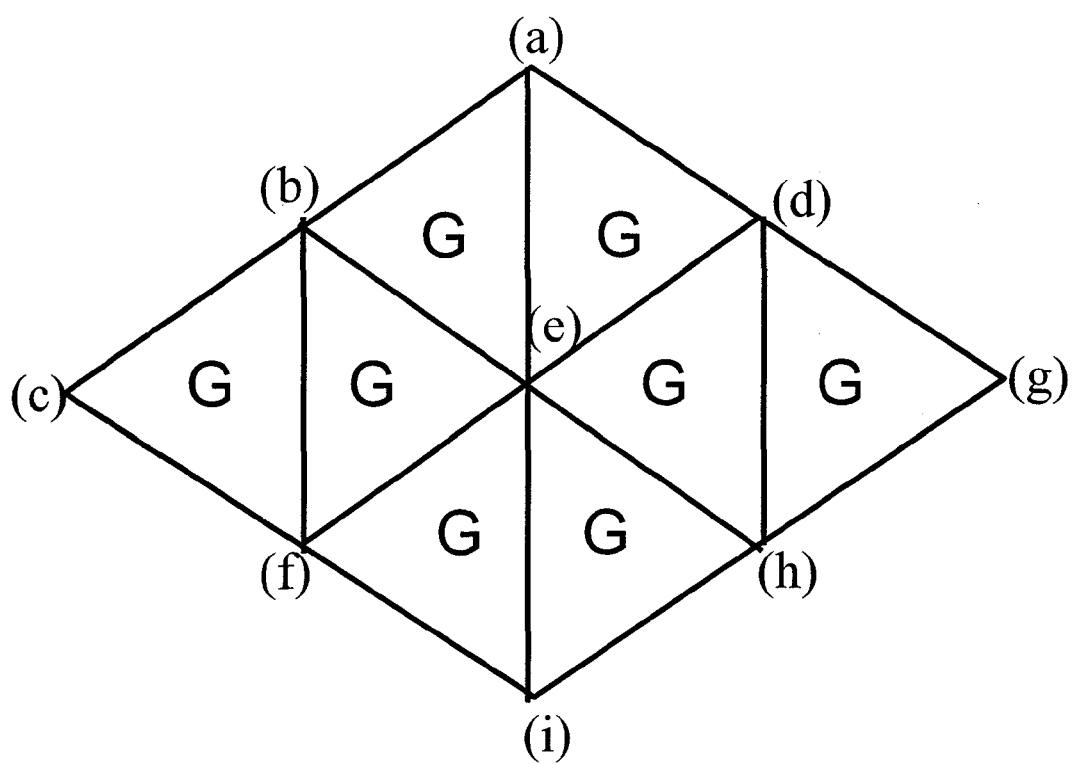
FIG. 20 illustrates a set of triangular areas and how to perform interpolation on the G color intensity according to the third preferred embodiment.

The points (a) through (i) shown in FIG. 20 represent the respective vertices of the collection of triangles shown in FIG. 19. That is why with each of those triangles supposed to represent a single pixel, the G color intensity of each triangular pixel can be estimated by interpolation to be the average of G1, G2 and G3 that are located at the three vertices. For example, if the G color intensity of a triangular pixel, of which the vertices are defined by the points (b), (f) and (e), respectively, is identified by $G_{b\text{-}f\text{-}e}$, the intensity $G_{b\text{-}f\text{-}e}$ can be calculated by the following Equation (18):

$$G_{b-f-e} = \frac{2(I_b + I_f + I_e)}{3T} \tag{18}$$

In Equation (18), $I_b$, $I_f$ and $I_e$ represent G color intensities that are measured at G pixels located at the points (b), (f) and (e), respectively.

<B and R Color Intensity Interpolation>

Figure 21:
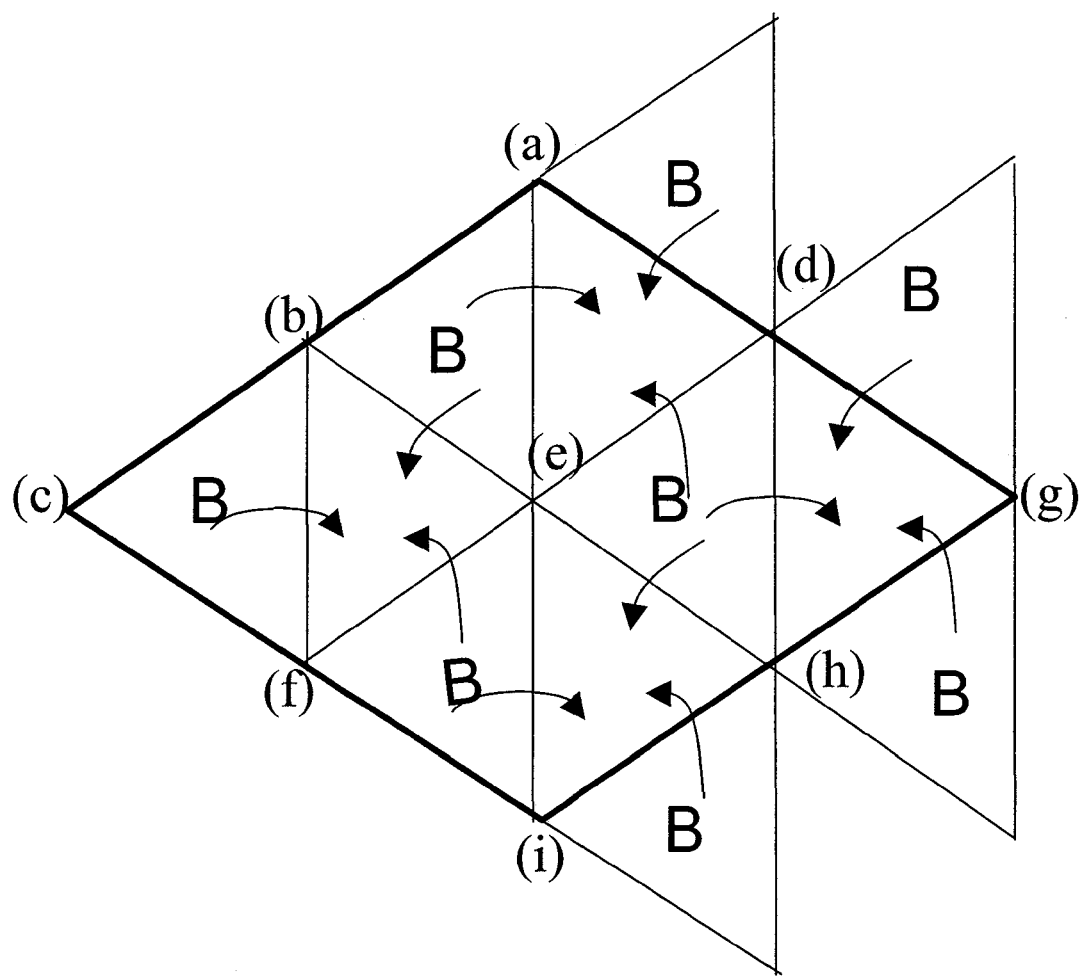
FIG. 21 illustrates a set of triangular areas and how to perform interpolation on the B color intensity according to the third preferred embodiment.
Figure 22:
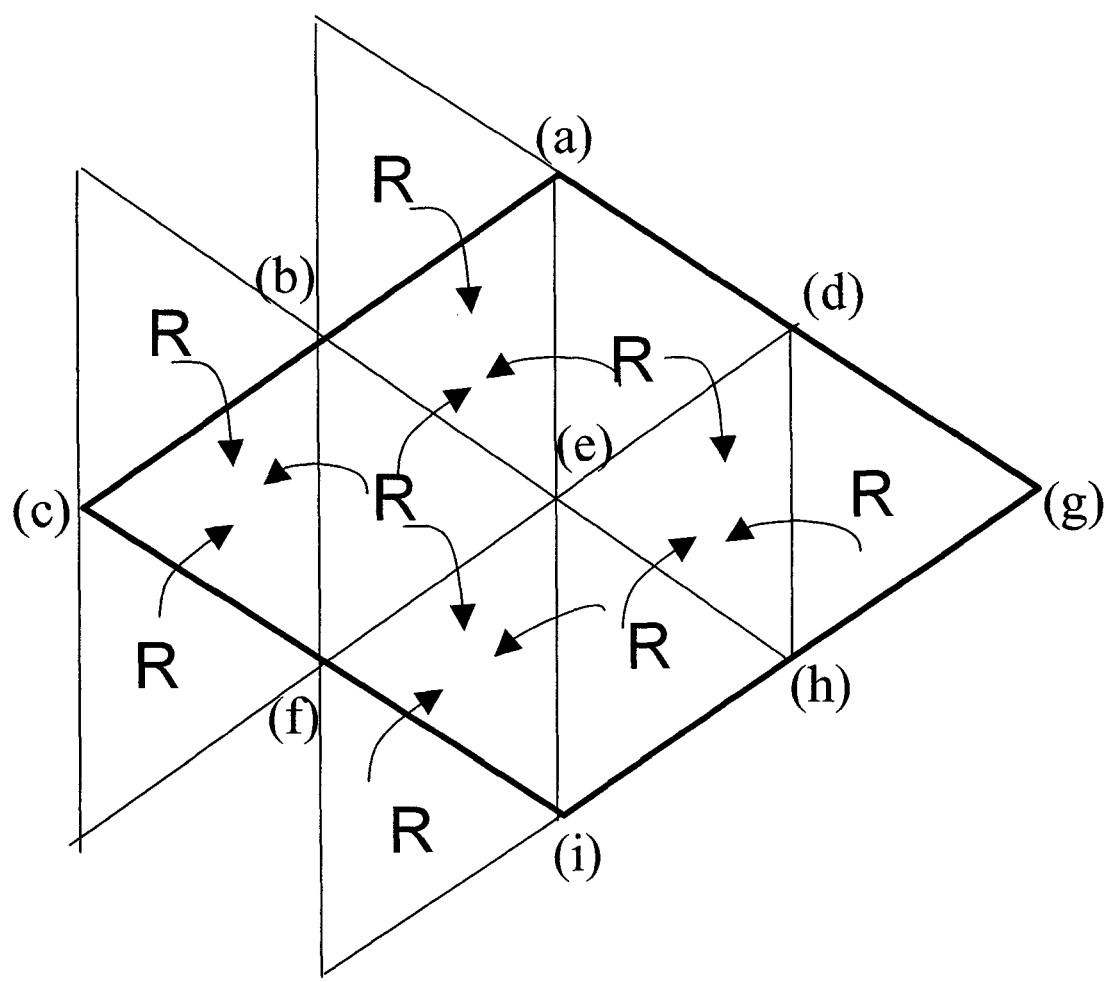
FIG. 22 illustrates a set of triangular areas and how to perform interpolation on the R color intensity according to the third preferred embodiment.

FIGS. 21 and 22 each illustrate a collection of triangles shown in FIG. 19. In each of FIGS. 21 and 22, shown are nine pixels that are located at points (vertices) (a) through (i), each of which represents a G polarization pixel G1, G2 or G3. In this case, as for a triangular area, from which either a B color intensity or an R color intensity is missing, interpolation is carried out using its surrounding triangles. For example, when interpolation is carried out to estimate a B color intensity, three surrounding triangular areas are used as indicated by the arrows shown in FIG. 21. Likewise, when interpolation is carried out to estimate an R color intensity, three surrounding triangular areas are used as indicated by the arrows shown in FIG. 22.

For example, if the B color intensity of a triangular pixel, of which the vertices are defined by the points (b), (f) and (e), respectively, is identified by $B_{b\text{-}f\text{-}e}$, the intensity $B_{b\text{-}f\text{-}e}$ can be calculated by the following Equation (19):

$$B_{b-f-e} = \frac{B_{b-c-f} + B_{a-b-e} + B_{e-f-i}}{3} \tag{19}$$

On the other hand, if the B color intensity of a triangular pixel, of which the vertices are defined by the points (e), (h)

and (d), respectively, is identified by $B_{b-f-e}$, the intensity $R_{e-h-d}$ can be calculated by the following Equation (20):

$$R_{e-h-d} = \frac{R_{a-e-d} + R_{e-i-h} + R_{d-h-g}}{3} \quad (20)$$

By performing these processing steps, a degree-of-polarization image, a polarization phase image representing a polarization phase φ at each pixel and an (RGB) full-color intensity image are generated for each of the triangular areas shown in FIG. 19.

Each of the preferred embodiments of the present invention described above includes not only the color and polarization obtaining section 101 but also the color mosaic interpolation section 102 and other image processing sections as shown in FIG. 1. However, the present invention can also be implemented as an image capture device, not just such an image processing apparatus. That is to say, the present invention can be carried out as an image capture device including the color mosaic filter 201, the patterned polarizer 202 and the image capture element's pixels 203 shown in FIG. 2.

Figure 23:
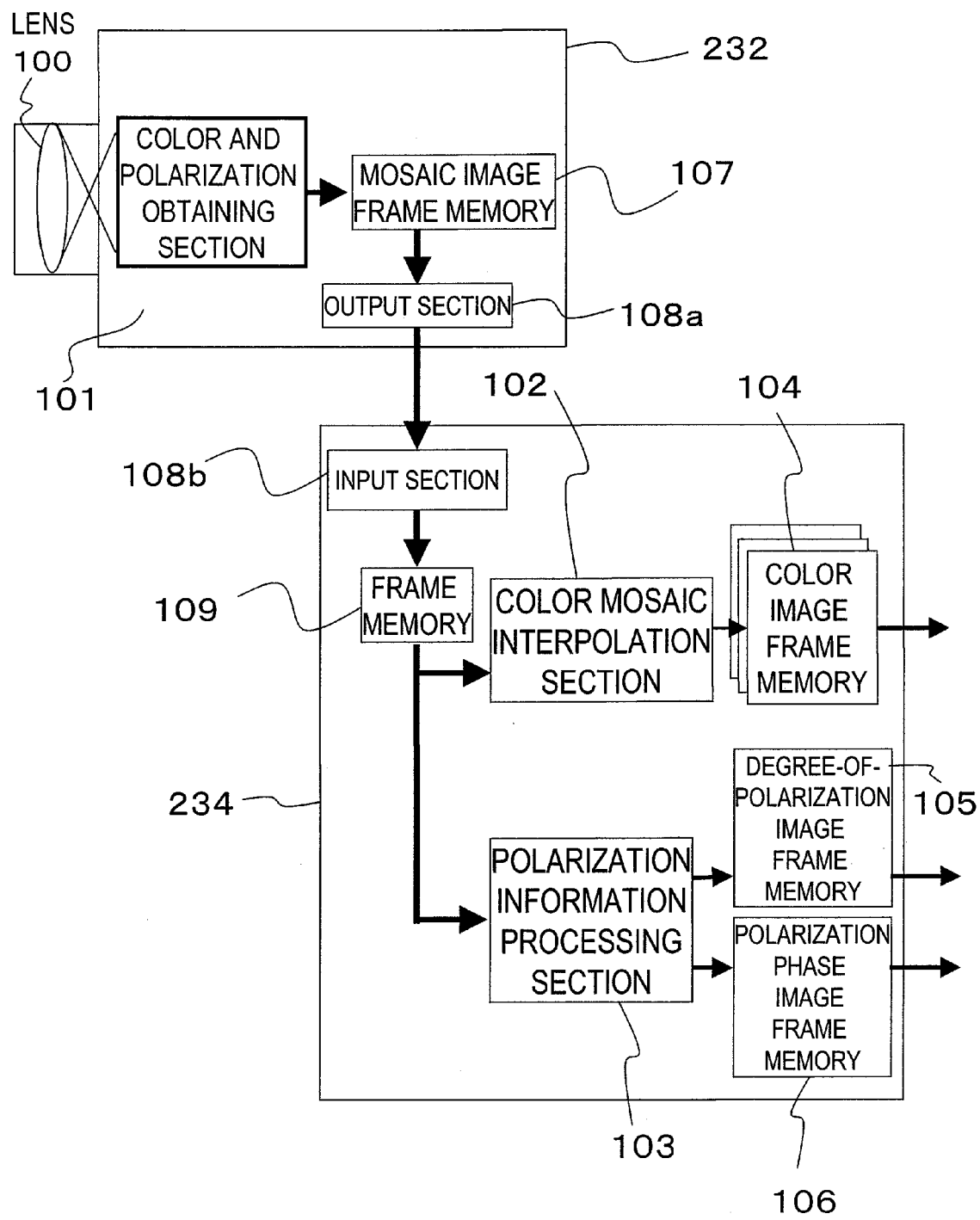
FIG. 23 is a block diagram illustrating a configuration for an image capture device according to a preferred embodiment of the present invention.

FIG. 23 is a block diagram illustrating a configuration for a preferred embodiment of an image capture device according to the present invention.

The image capture device 232 of this preferred embodiment includes the lens 100, the color and polarization obtaining section 101 and the mosaic image frame memory 107 of the first to third preferred embodiments described above, and further includes an output section 108a for outputting data in the mosaic image frame memory 107 to an external device.

The configuration and operation of the lens 100, color and polarization obtaining section 101 and mosaic image frame memory 107 of this preferred embodiment are just as already described for the first to third preferred embodiments of the present invention, and the description thereof will be omitted herein. The output section 108a has the function of reading data out from the mosaic image frame memory 107 and outputting the data to an external device.

The output signal of the image capture device 232 of this preferred embodiment is supplied to the processing apparatus 234 shown in FIG. 23. In the processing apparatus 234 shown in FIG. 23, an input section 108b receives the signal from the image capture device 232 and writes data on a frame memory 109. Data representing a mosaic image is sequentially read from the frame memory 109, sent to the color mosaic interpolation section 102 and subjected to interpolation processing there. The results of the interpolation processing are accumulated in the color image frame memory 104, in which R, G and B planes are provided for each pixel, and are retrieved from it as needed. Meanwhile, image signals are also sequentially read from the frame memory 109 and then sent to the polarization information processing section 103. Those image signals are processed by the polarization information processing section 103 and then stored in the degree-of-polarization image frame memory 105 and the polarization phase image frame memory 106. Data representing a degree-of-polarization image (ρ) is output from the degree-of-polarization image frame memory 105, while data representing a polarization phase image (φ) is output from the polarization phase image frame memory 106.

The processing apparatus 234 may be either a general purpose computer in which a software program for carrying out the processing steps shown in FIG. 12, for example, is installed or a processor that was specially manufactured to carry out the present invention.

INDUSTRIAL APPLICABILITY

The apparatus and method for image processing according to the present invention can obtain color information and polarization information from an object at the same time, and therefore, can be used in various types of digital still cameras, digital movie cameras, surveillance cameras and cameras for cars.

The invention claimed is:

1. An image processing apparatus comprising:
   a color and polarization obtaining section including a single-chip color image capture element that has a color mosaic filter and a patterned polarizer in which a number of polarizer units, having polarization transmission planes defining at least three different angles, are provided for multiple pixels of the same color in the color mosaic filter;
   a polarization information processing section for approximating, as a sinusoidal function, a relation between the intensities of light rays that have been transmitted through the polarizer units for the multiple pixels of the same color and the angles of the polarization transmission planes of the polarizer units; and
   a color mosaic interpolation section for generating a color intensity image using a triangular area as a pixel unit by performing a color intensity interpolation, the triangular area being comprised of three polarizer units that have polarization transmission planes defining mutually different angles and that are adjacent to each other.

2. The image processing apparatus of claim 1, wherein the patterned polarizer has a structure in which three types of polarizer units, having polarization transmission planes defining mutually different angles, are arranged adjacent to each other.

3. The image processing apparatus of claim 1, wherein the color mosaic filter has a structure in which pixels in a single particular color are arranged in a checkerboard pattern, and
   wherein the polarizer units are provided for those pixels that are arranged in the checkerboard pattern.

4. The image processing apparatus of claim 1, wherein the color mosaic filter has a structure defined by rotating a square lattice, in which pixels in a single particular color are arranged in a checkerboard pattern, 45 degrees, and
   wherein the polarizer units are provided for those pixels that are arranged in the checkerboard pattern.

5. The image processing apparatus of claim 4, wherein each said pixel has an octagonal shape.

6. The image processing apparatus of claim 3, wherein the single particular color is G (green) among R (red), G (green) and B (blue).

7. The image processing apparatus of claim 4, wherein the single particular color is G (green) among R (red), G (green) and B (blue).

8. The image processing apparatus of claim 1, wherein the color mosaic filter has a hexagonal lattice structure in which each said pixel has a hexagonal shape, and
   wherein the polarizer units are provided for the arrangement of those pixels in a single particular color.

9. The image processing apparatus of claim 1, wherein the color mosaic interpolation section calculates the average of intensities that have been measured in pixels of the same color, for which three types of polarizer units are provided, in the neighborhood of pixels that need to have their color intensities interpolated, thereby canceling the effect of polarization and performing interpolation on the color intensity, the three types of polarizer units having polarization transmission planes that define angles that are different from each other by 60 degrees.

10. An image processing method comprising the steps of:
measuring the intensities of respective pixels using a single-chip color image capture element in which three types of polarizer units, having polarization transmission planes defining mutually different angles, are provided for multiple pixels in a single particular color in a color pixel arrangement;
obtaining polarization information based on the intensities that have been measured in the three types of pixels in the single particular color, for which the polarization transmission planes define mutually different angles; and
generating a color intensity image by performing a color intensity interpolation using a triangular area as a pixel unit, the triangular area being comprised of three types of pixels in the single particular color, for which the polarization transmission planes define mutually different angles.

* * * * *